(12) United States Patent
Morimoto et al.

(10) Patent No.: US 8,824,236 B2
(45) Date of Patent: Sep. 2, 2014

(54) MEMORY ACCESS CONTROL DEVICE AND MANUFACTURING METHOD

(75) Inventors: Takashi Morimoto, Osaka (JP);
Takashi Hashimoto, Fukuoka (JP)

(73) Assignee: Panasonic Corporation, Osaka (JP)

(*) Notice: Subject to any disclaimer, the term of this patent is extended or adjusted under 35 U.S.C. 154(b) by 66 days.

(21) Appl. No.: 13/811,482

(22) PCT Filed: Feb. 21, 2012

(86) PCT No.: PCT/JP2012/001142
§ 371 (c)(1),
(2), (4) Date: Jan. 22, 2013

(87) PCT Pub. No.: WO2013/005355
PCT Pub. Date: Jan. 10, 2013

(65) Prior Publication Data
US 2013/0121093 A1     May 16, 2013

(30) Foreign Application Priority Data

Jul. 1, 2011   (JP) .................................. 2011-147218

(51) Int. Cl.
| G11C 8/00 | (2006.01) |
| G06F 13/00 | (2006.01) |
| G11C 8/04 | (2006.01) |
| G11C 29/00 | (2006.01) |

(52) U.S. Cl.
CPC *G11C 8/04* (2013.01); *G06F 13/00* (2013.01); *G11C 29/00* (2013.01)
USPC .......... 365/230.01; 365/185.11; 365/189.011; 365/201; 365/230.03

(58) Field of Classification Search
CPC ........... G11C 8/04; G11C 29/00; G06F 13/00
USPC ................ 365/185.11, 189.011, 201, 230.01, 365/230.03
See application file for complete search history.

(56) References Cited

U.S. PATENT DOCUMENTS

| 5,357,473 A | 10/1994 | Mizuno et al. |
| 2007/0168784 A1* | 7/2007 | Hazama ......................... 714/719 |

(Continued)

FOREIGN PATENT DOCUMENTS

| JP | 4-98342 | 3/1992 |
| JP | 9-22387 | 1/1997 |

(Continued)

OTHER PUBLICATIONS

International Search Report issued May 22, 2012 in corresponding International Application No. PCT/JP2012/001142.

(Continued)

*Primary Examiner* — Fernando Hidalgo
(74) *Attorney, Agent, or Firm* — Wenderoth, Lind & Ponack, L.L.P.

(57) ABSTRACT

A memory access control device including: a bit position information storage unit storing bit position information indicating one or more bit positions in a bit sequence of a predetermined length; a reading unit configured to attempt to read a bit sequence from the range specified by the logical address received by the logical address receiving unit, thereby receiving a first bit sequence from the external memory in units of the predetermined length, the first bit sequence being composed of bits that are larger in number than bits stored in the range specified by the logical address; a bit sequence extracting unit configured to extract one or more bit sequences from the first bit sequence at the one or more bit positions indicated by the bit position information in units of the predetermined length.

7 Claims, 34 Drawing Sheets

(56) References Cited

U.S. PATENT DOCUMENTS

| | | | |
|---|---|---|---|
| 2009/0141827 A1* | 6/2009 | Saito et al. | 375/295 |
| 2010/0192014 A1* | 7/2010 | Mejdrich et al. | 714/32 |
| 2010/0192041 A1 | 7/2010 | Jeddeloh | |

FOREIGN PATENT DOCUMENTS

| | | |
|---|---|---|
| JP | 2009-134573 | 6/2009 |
| JP | 2010-217991 | 9/2010 |
| JP | 2011-100898 | 5/2011 |
| WO | 2010/085647 | 7/2010 |

OTHER PUBLICATIONS

Jung-Sik Kim et al., "A 1.2V 12.8GB/s 2Gb Mobile Wide-I/O DRAM with 4×128 I/Os Using TSV-Based Stacking", IEEE International Solid-State Circuits Conference, 2011, pp. 496-497.

* cited by examiner

FIG. 2A  Good-quality product for high functionality
(no defective-contact microbump)
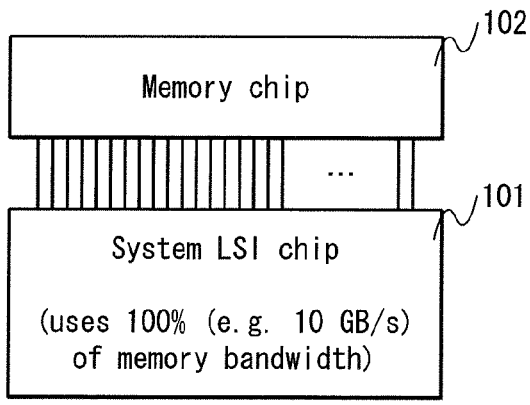
FIG. 2B  Good-quality product for popular use
(small number of defective-contact microbumps)
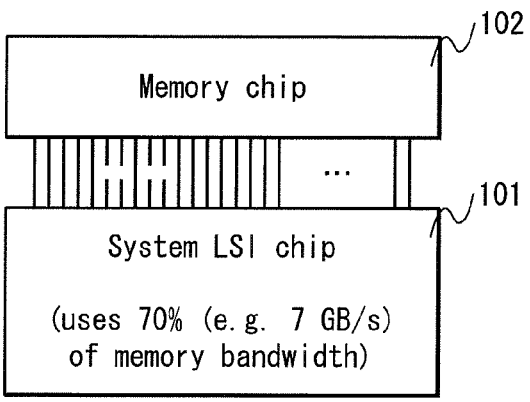
FIG. 2C  Defective product
(large number of defective-contact microbumps)
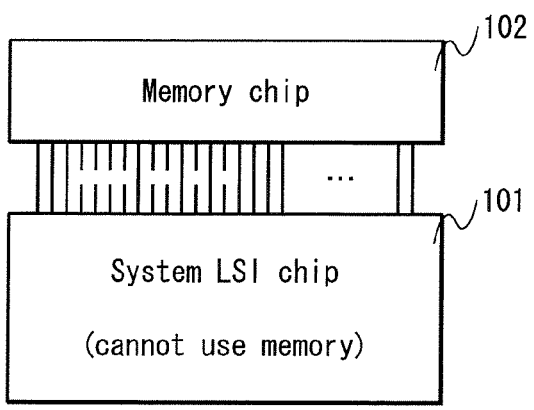

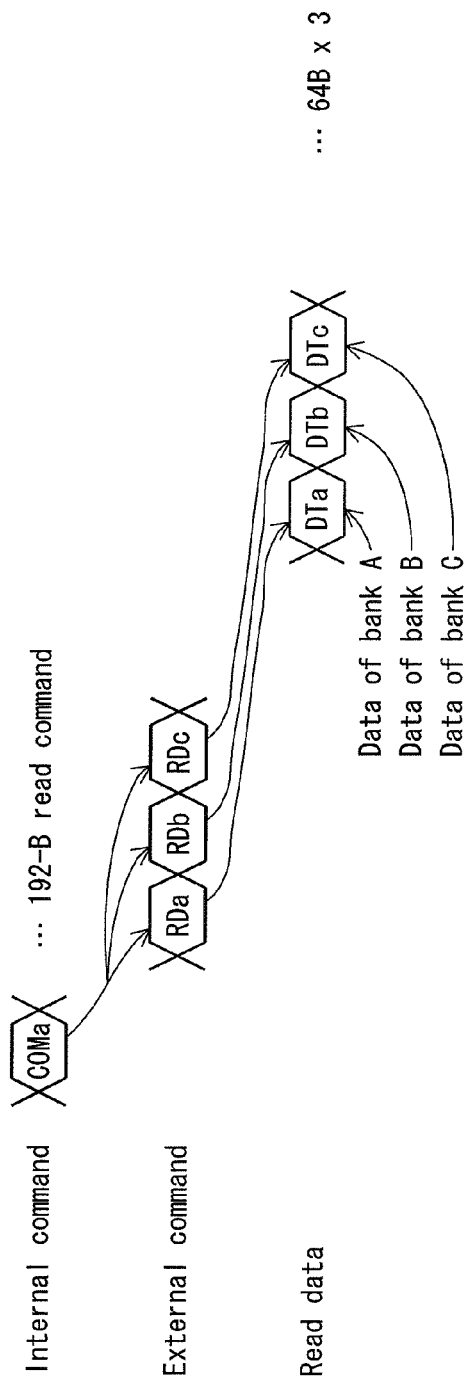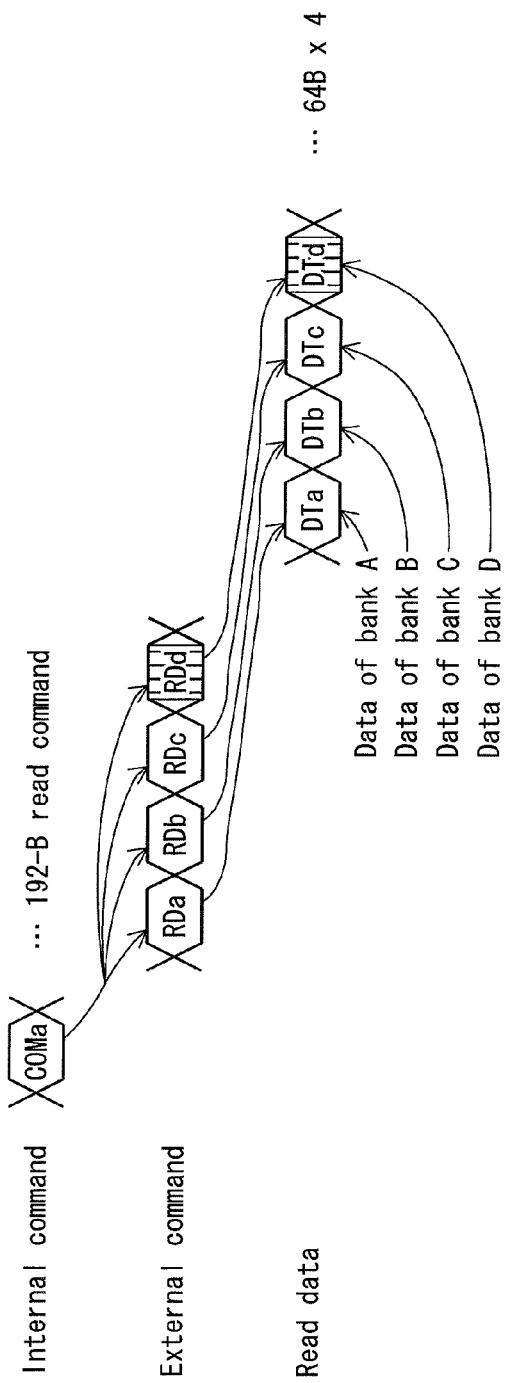

FIG. 29

| Fixed value [3:0] | Row [11:0] | Column [7:0] | Bank [1:0] | Fixed value [5:0] |
|---|---|---|---|---|
| 3205 | 3204 | 3203 | 3202 | 3201 |

31  28 27           16 15           9 8 7  6 5           0

Column[0] is fixed to "0"

FIG. 32

| 2905 Fixed value [4:0] | | 2904 Row [11:0] | | 2903 Column [7:0] | 2902 Bank [1:0] | 2901 Fixed value [4:0] |
|---|---|---|---|---|---|---|
| 31 27 | 26 | | 15 | 14 7 | 6 5 | 4 0 |

MEMORY ACCESS CONTROL DEVICE AND MANUFACTURING METHOD

TECHNICAL FIELD

The present invention relates to a memory access control technology.

BACKGROUND ART

Conventionally, a three-dimensional integrated circuit composed of a laminate of a plurality of semiconductor-chip layers packed in one package is known.

In the three-dimensional integrated circuit, the layered semiconductor chips are connected with each other by bumps such as microbumps (see, for example, Non-Patent Literature 1).

Meanwhile, connecting the layered semiconductor chips requires an advanced minute processing technique, and an occurrence of a certain degree of defective contacts is unavoidable.

When one or more defective contacts occur in the connection between semiconductor chips in the three-dimensional integrated circuit, a failure may occur due to the presence of the defective contacts.

Patent Literature 1, for example, discloses a technology among known conventional technologies which, even if one or more defective contacts occur in the connection between semiconductor chips and a failure might occur due to the presence of the defective contacts, prevent the failure from occurring with high probability.

According to this technology, when one or more defective contacts occur in the connection between semiconductor chips, data transfer rate of a terminal, in which no defective contact has occurred, is increased so that the terminal transmits data that should have been transmitted by a terminal in which one or more defective contacts have occurred.

CITATION LIST

Patent Literature

Patent Literature 1: Japanese Patent Application Publication No. 2009-134573

Non-Patent Literature

Non-Patent Literature 1: J-S, Kim, et al., "A 1.2V 12.8 GB/s 2 Gb Mobile Wide-IO DRAM with 4×128 I/Os Using TSV-Based Stacking," pp. 496-497, Digest of ISSCC (2011)

SUMMARY OF INVENTION

Technical Problem

When the technology disclosed in Patent Literature 1 is attempted to be used in a three-dimensional integrated circuit in which a logic chip and a memory chip are layered, the logic chip including: masters (for example, a processor, a video decoder, and the like) that use storage areas; and a memory access control device that control accesses of the masters to the storage areas, and the memory chip including the storage areas to be used by the masters, it is at least necessary to add, in an interface circuit of the memory chip, a circuit (hereinafter referred to as "terminal assignment changing circuit") that changes the assignment of input/output terminals to the data to be read from the storage areas and to the data to be written to the storage areas.

However, if the terminal assignment changing circuit is added in the interface circuit of the memory chip, the memory chip will be higher in price than standard chips available in the market. Thus a three-dimensional integrated circuit having a memory chip added with the terminal assignment changing circuit would be higher in cost than a three-dimensional integrated circuit having a standard memory chip.

It is therefore an object of the present invention to provide a memory access control device in which masters included in a logic chip can use a memory chip even when only partial bits among a bit sequence transmitted from the memory chip are received due to presence of defective contacts and the like between the logic chip and the memory chip in a three-dimensional integrated circuit including layers of the logic chip and the memory chip, wherein the memory chip does not include the terminal assignment changing circuit.

Solution to Problem

The above object is fulfilled by a memory access control device comprising: a logical address receiving unit configured to receive a logical address specifying a range in a storage area of an external memory; a bit position information storage unit storing bit position information indicating one or more bit positions in a bit sequence of a predetermined length; a reading unit configured to attempt to read a bit sequence from the range specified by the logical address received by the logical address receiving unit, thereby receiving a first bit sequence from the external memory in units of the predetermined length, the first bit sequence being composed of bits that are larger in number than bits stored in the range specified by the logical address; a bit sequence extracting unit configured to extract one or more bit sequences from the first bit sequence at the one or more bit positions indicated by the bit position information in units of the predetermined length; and an output unit configured to generate a second bit sequence composed of bits that are equal in number to the bits stored in the range specified by the logical address, by using the one or more bit sequences extracted by the bit sequence extracting unit and output the generated second bit sequence.

Advantageous Effects of Invention

With the above-described structure of the memory access control device of the present invention, when the logic chip can receive only some portions of the bit sequence transmitted from the memory chip due to a defective contact or the like, the master can use the memory chip nonetheless by storing in advance the bit position information that indicates bit positions of the bits that can can be received, and storing data, which is used by the master, in advance to a storage area that is not susceptible to a defective contact or the like among the whole storage area of the memory chip.

BRIEF DESCRIPTION OF DRAWINGS

FIG. 2A is a schematic illustration of an integrated circuit 100 that is a good-quality product for high functionality. FIG. 2B is a schematic illustration of an integrated circuit 100 that is a good-quality product for popular use. FIG. 2C is a schematic illustration of an integrated circuit 100 that is a defective product.

FIG. 7A is a timing chart 1 of a data reading. FIG. 7B is a timing chart 2 of a data reading.

FIG. 29 is a structure diagram illustrating the structure of the logical address of the memory chip 102.

FIG. 32 is a structure diagram illustrating the structure of the logical address of the memory chip 102.

DESCRIPTION OF EMBODIMENTS

Embodiment 1

Outline

The following describes, as one example of a memory access control device of the present invention, an integrated circuit which is composed of layers of: a system LSI (Large Scale Integration) chip including masters and a memory access controller, wherein the masters use storage areas and the memory access controller controls accesses of the masters to the storage areas; and a memory chip having the storage areas that are used by the masters, wherein the system LSI chip layer and the memory chip layer are connected with each other via microbumps.

This integrated circuit is selected as a good-quality product for high functionality when it is determined, based on the inspection results during manufacturing, that a defective contact has not occurred in the plurality of microbumps connecting the system LSI chip and the memory chip. Furthermore, even if it is determined that a predetermined microbump group, among the plurality of microbumps connecting the system LSI chip and the memory chip, includes one or more defective-contact microbumps, when the number of the defective-contact microbumps is smaller than a predetermined number, the integrated circuit is selected as a good-quality product for popular use in which part of functions of the good-quality product for high functionality is restricted.

The following describes the integrated circuit of Embodiment 1 with reference to the attached drawings.

Figure 1:
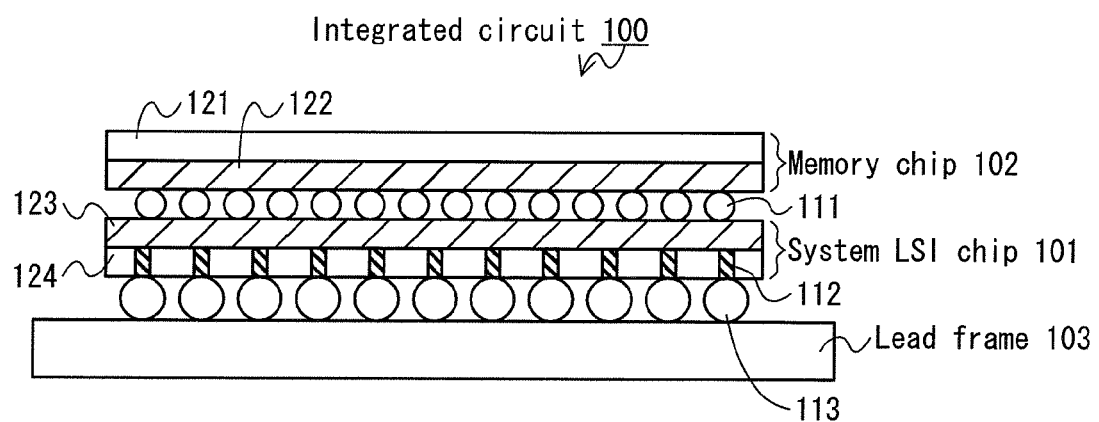
FIG. 1 is a cross-sectional view illustrating schematically a cross section of an integrated circuit 100.

FIG. 1 is a cross-sectional view illustrating schematically a cross section of an integrated circuit 100.

With reference to FIG. 1, a system LSI chip 101 is a logic chip including a plurality of masters and a memory access controller, wherein the masters use storage areas, and the memory access controller controls accesses of the masters to the storage areas. The system LSI chip 101 includes a transistor layer 124 and a routing layer 123. The transistor layer 124 is provided with TSVs (Through Silicon Vias) through which signals, which are formed on a wiring formed in the routing layer 123, are extracted outside the main surface on the transistor layer 124 side.

The system LSI chip 101 has a function to decode one digital TV broadcast program when 192 MB of external memory and 7 GB/s of memory bandwidth are secured for use, and has a function to decode two digital TV broadcast programs at the same time when 256 MB of external memory and 10 GB/s of memory bandwidth are secured for use.

A memory chip 102 is a general-purpose memory chip having a storage area used by the masters included in the system LSI chip 101, and includes a transistor layer 121 and a routing layer 122.

A lead frame 103 supports and fixes the system LSI chip 101, and connects respective TSV terminals of the system LSI chip 101 with respective terminals of a substrate (not illustrated) provided outside the integrated circuit 100.

The system LSI chip 101 and the memory chip 102 are overlaid such that the routing layers thereof face each other, and are connected with each other via a plurality of microbumps 111.

The plurality of microbumps 111 connecting the system LSI chip 101 and the memory chip 102 include a group of microbumps (hereinafter referred to as "memory data microbump group") which is composed of 512 microbumps and transmits data having been read from the memory chip 102 and data to be written to the memory chip 102.

When the microbumps connecting the system LSI chip 101 and the memory chip 102 do not have a defective-contact microbump, the system LSI chip 101 uses the memory chip 102 in 10 GB/s bandwidth. When the memory data microbump group has 128 or less defective-contact microbumps, the system LSI chip 101 uses the memory chip 102 in 7 GB/s bandwidth by communicating with the memory chip 102 without using the defective-contact microbumps.

The system LSI chip 101 and the lead frame 103 are overlaid such that the main surface of the system LSI chip 101 on the transistor layer 124 side faces the lead frame 103, and are connected with each other via a plurality of microbumps 113.

The system LSI chip 101, the memory chip 102 and the lead frame 103 are sealed by resin in one package (not illustrated).

FIG. 2A is a schematic illustration of an integrated circuit 100 that is a good-quality product for high functionality.

In FIG. 2A, the lines between the system LSI chip 101 and the memory chip 102 schematically represent the microbumps connecting the system LSI chip 101 and the memory chip 102.

The good-quality product for high functionality is an integrated circuit 100 in the state where the microbumps connecting the system LSI chip 101 and the memory chip 102 do not have a defective-contact microbump. In this state, the system LSI chip 101 uses a 256 MB memory area in the memory chip 102 as the external memory, and performs a data communication with the memory chip 102 in 10 GB/s bandwidth.

FIG. 2B is a schematic illustration of an integrated circuit 100 that is a good-quality product for popular use.

In FIG. 2B, the lines between the system LSI chip 101 and the memory chip 102, as in FIG. 2A, schematically represent the microbumps connecting the system LSI chip 101 and the memory chip 102. Some break lines included in these lines indicate that some of the microbumps are defective-contact microbumps.

The good-quality product for popular use is an integrated circuit 100 in the state where the memory data microbump group has 128 or less defective-contact microbumps. In this state, the system LSI chip 101 uses a 192 MB memory area in the memory chip 102 as the external memory, and performs a data communication with the memory chip 102 in 7 GB/s bandwidth.

FIG. 2C is a schematic illustration of an integrated circuit 100 that is a defective product.

In FIG. 2C, the lines between the system LSI chip 101 and the memory chip 102, as in FIGS. 2A and 2B, schematically represent the microbumps connecting the system LSI chip 101 and the memory chip 102. Some break lines included in these lines indicate that some of the microbumps are defective-contact microbumps.

The defective product is an integrated circuit 100 in the state where the memory data microbump group has 129 or more defective-contact microbumps, or in the state where one or more microbumps other than those of the memory data microbump group are defective-contact microbumps. In this state, the system LSI chip 101 cannot decode the digital TV broadcast program by using the memory chip 102.

The following describes details of the integrated circuit 100 with reference to the drawings.

<Structure>

Figure 3:
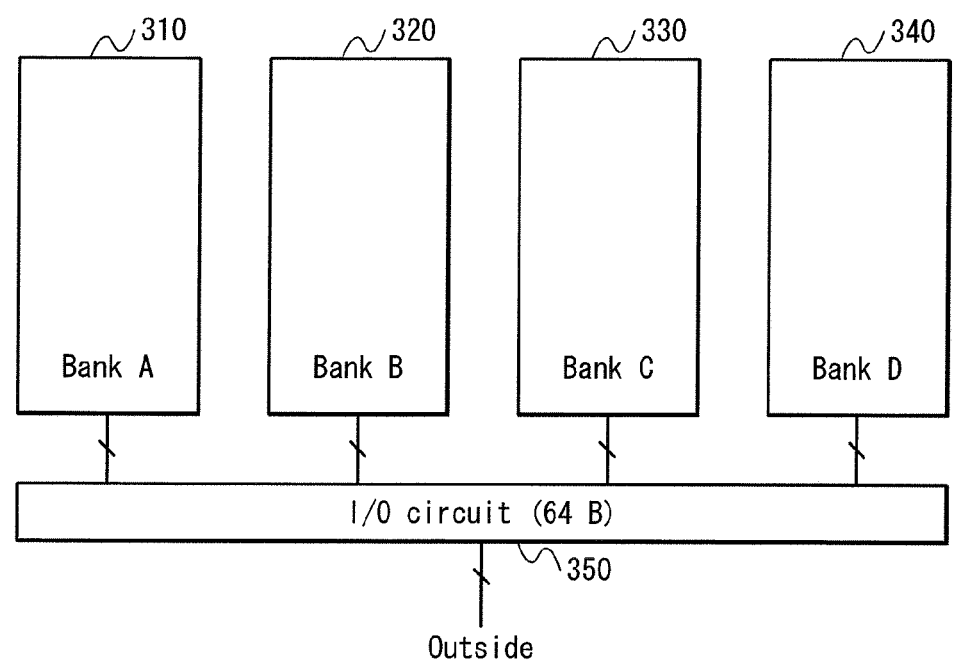
FIG. 3 is a schematic structure diagram illustrating main hardware components of the memory chip 102.

FIG. 3 is a schematic structure diagram illustrating main hardware components of the memory chip 102.

As illustrated in FIG. 3, the memory chip 102 includes banks A 310, B 320, C 330 and D 340 and an I/O circuit 350.

The banks A 310, B 320, C 330 and D 340 are each a memory having a 64-MB storage area from/to which data is read/written in units of 512 bits (=64 B), are each specified by a 12-bit row address and an 8-bit column address, and are each connected with the I/O circuit 350.

The I/O circuit 350 is connected with the banks A 310, B 320, C 330 and D 340 and the system LSI chip 101, and has a function to output 512-bit data, which is read from any of the banks A 310, B 320, C 330 and D 340, to the outside, and a function to output 512-bit data, which is input from the outside, to any of the banks A 310, B 320, C 330 and D 340.

Figure 4:
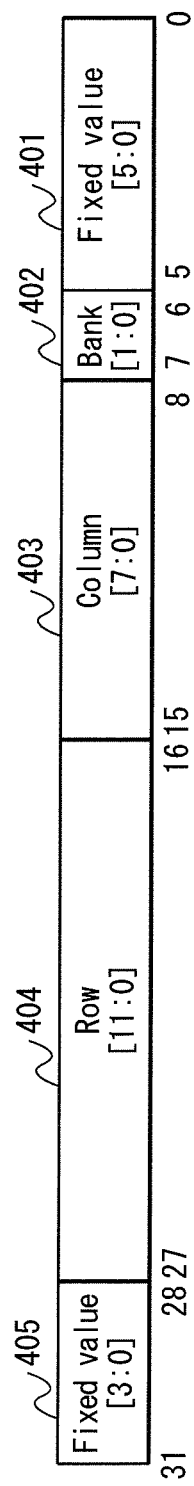
FIG. 4 is a structure diagram illustrating the structure of the logical address of the memory chip 102.

FIG. 4 is an address structure diagram indicating the relationships between the logical address used by the masters in the system LSI chip 101 and the physical address specifying a storage area in the memory chip 102. The masters in the system LSI chip 101 use the logical addresses so as to automatically specify physical addresses such as the physical row and column addresses of the memory chip 102. In the present embodiment, a 32-bit logical address is used.

As illustrated in FIG. 4, the logical address corresponding to a storage area of the memory chip 102 is composed of a 6-bit fixed value field 401, a 2-bit bank address field 402 specifying a bank in the memory chip 102, an 8-bit column address field 403, a 12-bit row address field 404, and a 4-bit fixed value field 405. Of these, the bank address field 402, 8-bit column address field 403, and 12-bit row address field 404 constitute a physical address of the memory chip 102.

The bank address field 402 stores an address that specifies one of the four banks (banks A 310, B 320, C 330 and D 340: see FIG. 3) included in the memory chip 102.

The column address field 403 stores a column address that specifies a column in a bank.

The row address field 404 stores a row address that specifies a row in a bank.

The fixed value field 401 is set to a fixed value "0x00" since data is read/written in units of 64 B. This is because the logical address is the addressing in units of bytes.

The fixed value field 405 is set to a fixed value "0x3". The logical address is an address mapping of the whole system. Thus the logical address is used as, for example, an address of an internal memory other than an address of an external memory. For this reason, when a master accesses an external memory, the master sets the fixed value "0x3", which indicates the external memory, in the fixed value field 405 that is located at the head of the logical address.

Note that the method for converting a logical address to a physical address is not limited to the method illustrated in FIG. 4, but it may be optimized, taking into accounts the specifications of the memory chip 102 and the memory access patterns of the masters, such that a memory access overhead does not occur.

Figure 5:
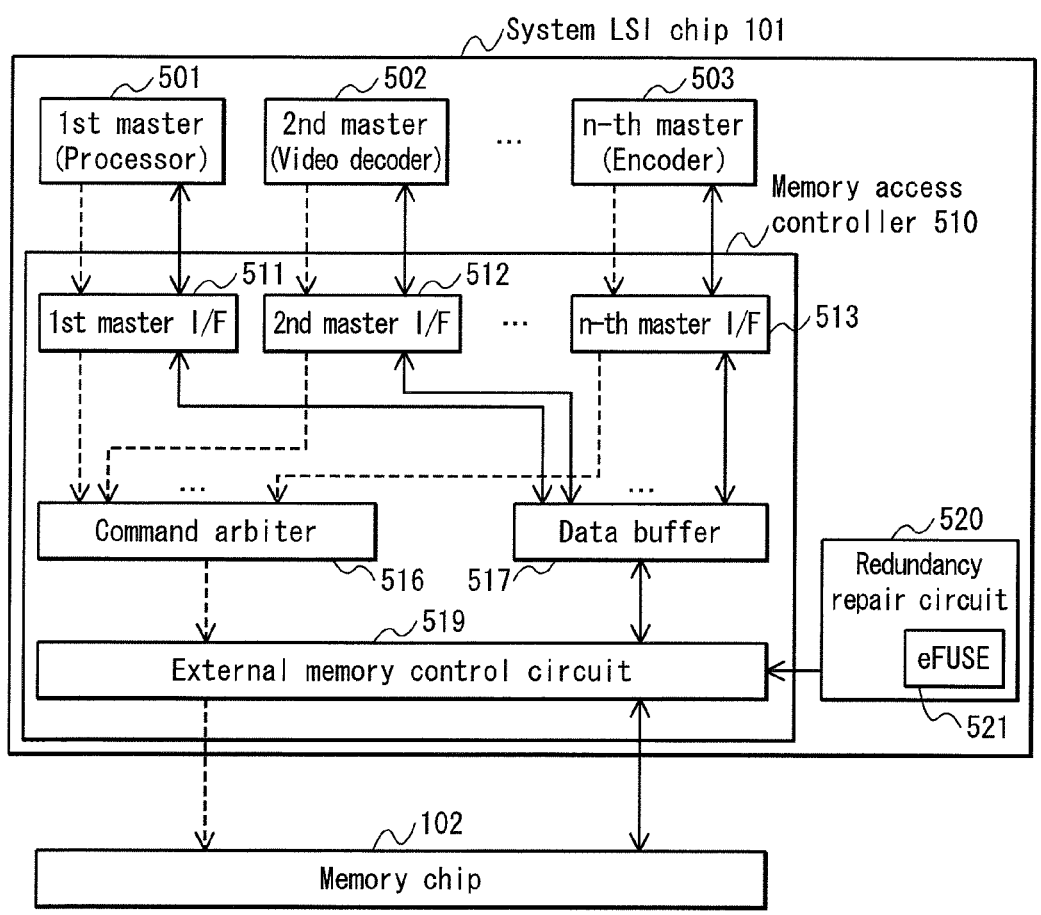
FIG. 5 is a schematic structure diagram illustrating main hardware components of the system LSI chip 101.

FIG. 5 is a schematic structure diagram illustrating main hardware components of the system LSI chip 101.

As illustrated in FIG. 5, the system LSI chip 101 includes a first master 501, a second master 502, . . . , an $n^{th}$ master 503, a memory access controller 510, and a redundancy repair circuit 520. Of these, the memory access controller 510 includes a first master interface 511, a second master interface 512, ..., an $n^{th}$ master interface 513, a command arbiter 516, a data buffer 517, and an external memory control circuit 519.

The first master 501 is a processor connected with the first master interface 511 of the memory access controller 510, and uses the storage area of the memory chip 102 via the memory access controller 510. The first master 501 realizes various functions by executing a program stored in the storage area of the memory chip 102.

The second master 502 is a video decoder connected with the second master interface 512 of the memory access controller 510, is controlled by the first master 501 which is a processor, and has a function to decode encoded image data stored in the storage area of the memory chip 102 by using the storage area of the memory chip 102 via the memory access controller 510.

The $n^{th}$ master 503 is an encoder connected with the $n^{th}$ master interface 513 of the memory access controller 510, is controlled by the first master 501 which is a processor, and has a function to encode image data stored in the storage area of the memory chip 102 by using the storage area of the memory chip 102 via the memory access controller 510.

The redundancy removal circuit 520 is connected with the external memory control circuit 519, includes an eFUSE circuit 521, and has a function to store microbump IDs identifying defective-contact microbumps when information is written to the eFUSE circuit 521 from outside the integrated circuit 100 by using an LSI tester or the like.

It should be noted here that writing information to the eFUSE circuit 521 refers to causing an electromigration to occur in a certain eFUSE group, which corresponds to the information to be written, among a plurality of eFUSEs, thereby cutting the eFUSE group.

Also, the microbumps identified by the stored microbump IDs are limited to those included in the memory data microbump group, and do not include those included in microbump groups that convey physical addresses, instructions and the like to be transmitted to the memory chip 102.

The first master interface 511 is connected with the first master 501, command arbiter 516, and data buffer 517, includes a command buffer for storing a command issued from the first master 501 to use a storage area of the memory chip 102 (hereinafter the command is referred to as "master-issued memory command"), and has: a function to receive a master-issued memory command from the first master 501, temporarily store the received master-issued memory command in the command buffer, and output the command to the command arbiter 516; a function to receive, from the data buffer 517, data having been read from a storage area of the memory chip 102 and output the data to the first master 501; and a function to receive, from the first master 501, data to be written to a storage area of the memory chip 102 and output the data to the data buffer 517.

It should be noted here that the master-issued memory command includes: access type information that indicates either "read" or "write"; a logical address indicating a starting address of a storage area to be used; and bit width information (the number of bursts) that indicates a bit width of the storage area to be used.

The second master interface 512 is a circuit that is similar to the first master interface 511, and is connected with the second master 502, command arbiter 516 and data buffer 517.

The $n^{th}$ master interface 513 is a circuit that is similar to the first master interface 511 and second master interface 512, and is connected with the $n^{th}$ master 503, command arbiter 516 and data buffer 517.

The command arbiter 516 is connected with the first master interface 511, second master interface 512, ..., $n^{th}$ master interface 513 and external memory control circuit 519, and has: a function to receive master-issued memory commands from a plurality of master interfaces; a function to assign priorities to the received master-issued memory commands based on a predetermined priority assignment method; and a function to send the master-issued memory commands to the external memory control circuit 519 in a descending order of the assigned priorities (in an order from the highest to the lowest priority).

The data buffer 517 is connected with the first master interface 511, second master interface 512, ..., $n^{th}$ master interface 513 and external memory control circuit 519, and has: a function to receive data to be written to a memory from the first master interface 511, ..., $n^{th}$ master interface 513 and send the data to the external memory control circuit 519; and a function to receive data having been read from the memory from the external memory control circuit 519 and send the data to one of the first master interface 511, ..., $n^{th}$ master interface 513.

Figure 6:
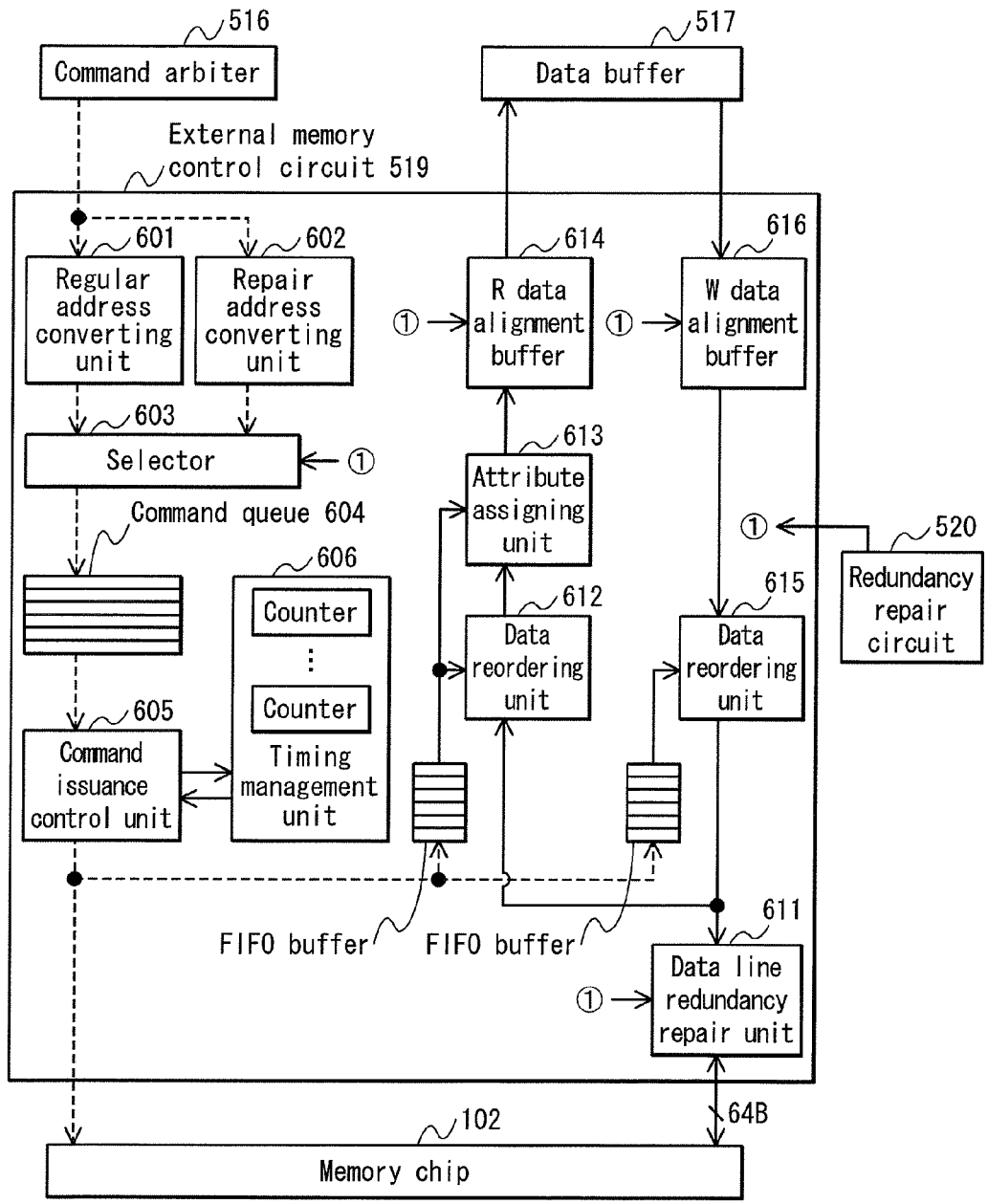
FIG. 6 is a schematic structure diagram illustrating main functions of the external memory control circuit 519.

FIG. 6 is a schematic structure diagram illustrating main functions of the external memory control circuit 519.

As illustrated in FIG. 6, the external memory control circuit 519 includes a regular address converting unit 601, a repair address converting unit 602, a selector 603, a command queue 604, a command issuance control unit 605, a timing management unit 606, a data line redundancy repair unit 611, a data reordering unit 612, an attribute assigning unit 613, an R data alignment buffer 614, a data reordering unit 615, and a W data alignment buffer 616.

The regular address converting unit 601 is connected with the command arbiter 516 and selector 603, and has the following two functions.

Function 1: a regular address converting function of converting a logical address, which indicates a starting address of an m-bit storage area included in a master-issued memory command received from the command arbiter 516, to an external-memory physical address which indicates a starting address of an m-bit storage area in the 256-MB storage area composed of the four banks (banks A 310, B 320, C 330 and D 340) in the memory chip 102.

It should be noted here that the "m-bit storage area" corresponds to the bit width of the storage area ("the number of bursts"×"data width") when the bit width information included in the master-issued memory command indicates m bits.

Function 2: an instruction converting function of converting, by using the physical address obtained by performing the regular address converting function, a memory access instruction, which is included in a master-issued memory command received from the command arbiter 516, to an instruction that can be used by the memory chip 102 (hereinafter referred to as "memory instruction").

It should be noted here that the memory instruction includes: access type information that indicates either "read" or "write"; and a physical address indicating a starting address of a storage area to be used, wherein the bit width for "read" and "write" is fixed to 512 bits (=64 B).

FIG. 7A is a timing chart illustrating an example case where a master-issued memory command is input to the regular address converting unit 601, the master-issued memory command is converted to a memory instruction and the memory instruction is output by the regular address converting unit 601, and as a result, data is read from the memory chip 102. In this example case, the master-issued memory command instructs to read continuous 192-B data from a storage area in the memory chip 102 whose starting address is physical address "0x30000000".

The regular address converting unit 601, upon receiving the master-issued memory command instructing to read continuous 192-B data, generates memory instructions RDa, RDb, and RDc by using the regular address converting function and instruction converting function and outputs the generated memory instructions, wherein the memory instructions RDa, RDb, and RDc instruct to read data from 64-B storage areas of the banks A 310, B 320 and C 330 that are respectively specified by the same row address "0x000" and the same column address "0x00".

Upon receiving these memory instructions, the memory chip 102 reads 64-B data DTa, 64-B data DTb and 64-B data DTc from the banks A 310, B 320 and C 330, respectively, and outputs the read data DTa, DTb and DTc.

Figure 8A:
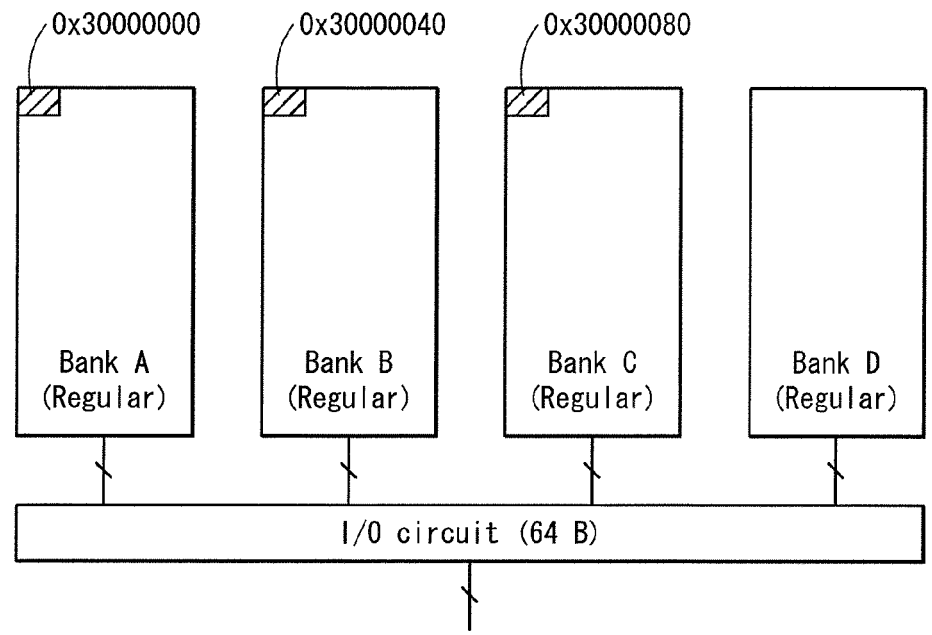
FIG. 8A is a schematic diagram illustrating the areas respectively storing data DTa, DTb and DTc.

FIG. 8A is a schematic diagram illustrating the areas respectively storing data DTa, DTb and DTc in the above example.

As illustrated in FIG. 8A, in the above example case, the starting physical address of the area storing data DTa is row address "0x000" and column address "0x00" of the bank A 310, the starting physical address of the area storing data DTb is row address "0x000" and column address "0x00" of the bank B 320, and the starting physical address of the area storing data DTc is row address "0x000" and column address "0x00" of the bank C 330.

Back to FIG. 6, the description of the external memory control circuit 519 is continued.

The repair address converting unit 602 is connected with the command arbiter 516 and selector 603, and has the following two functions.

Function 1: a repair address converting function of converting a logical address, which indicates a starting address of an m-bit storage area included in a master-issued memory command received from the command arbiter 516, to (i) a physical address which indicates a starting address of an m-bit storage area in the 192-MB storage area composed of banks A 310, B 320 and C 330 in the memory chip 102, and (ii) a physical address which indicates a starting address of a k-bit storage area in the 64-MB storage area composed of bank D 340 in the memory chip 102.

It should be noted here that the relationship between the m-bit storage area and the k-bit storage area is as follows. That is to say, the k-bit storage area is a storage area including three storage areas: (1) a storage area of bank D indicated by a pair of a row address and a column address which specify a storage area of the bank A 310 among m-bit storage areas; (2) a storage area of bank D indicated by a pair of a row address and a column address which specify a storage area of the bank B 320 among m-bit storage areas; and (3) a storage area of bank D indicated by a pair of a row address and a column address which specify a storage area of the bank C 330 among m-bit storage areas.

Function 2: an instruction converting function of converting, by using the physical address obtained by performing the repair address converting function, a memory access instruction, which is included in a master-issued memory command received from the command arbiter 516, to a memory instruction that can be used by the memory chip 102.

FIG. 7B is a timing chart illustrating an example case where a master-issued memory command is input to the repair address converting unit 602, the master-issued memory command is converted to a memory instruction and the memory instruction is output by the repair address converting unit 602, and as a result, data is read from the memory chip 102. In this example case, the master-issued memory command instructs to read continuous 192-B data from a storage area in the memory chip 102 whose starting address is physical address "0x30000000".

The repair address converting unit 602, upon receiving the master-issued memory command instructing to read continuous 192-B data, generates memory instructions RDa, RDb, RDc and RDd by using the repair address converting function and instruction converting function and outputs the generated memory instructions, wherein the memory instructions RDa, RDb and RDc instruct to read data from 64-B storage areas of the banks A 310, B 320 and C 330 that are respectively specified by the same row address "0x000" and the same column address "0x00", and the memory instruction RDd instructs to read data from the bank D 340. It should be noted here that, since the memory instructions RDa, RDb and RDc have the same pair of row address and column address, the memory instruction RDd has the same pair of row address and column address as the memory instructions RDa, RDb and RDc.

Upon receiving these memory instructions, the memory chip 102 reads 64-B data DTa, 64-B data DTb, 64-B data DTc and 64-B data DTd from the banks A 310, B 320, C 330 and D 340, respectively, and outputs the read data DTa, DTb, DTc and DTd.

Figure 8B:
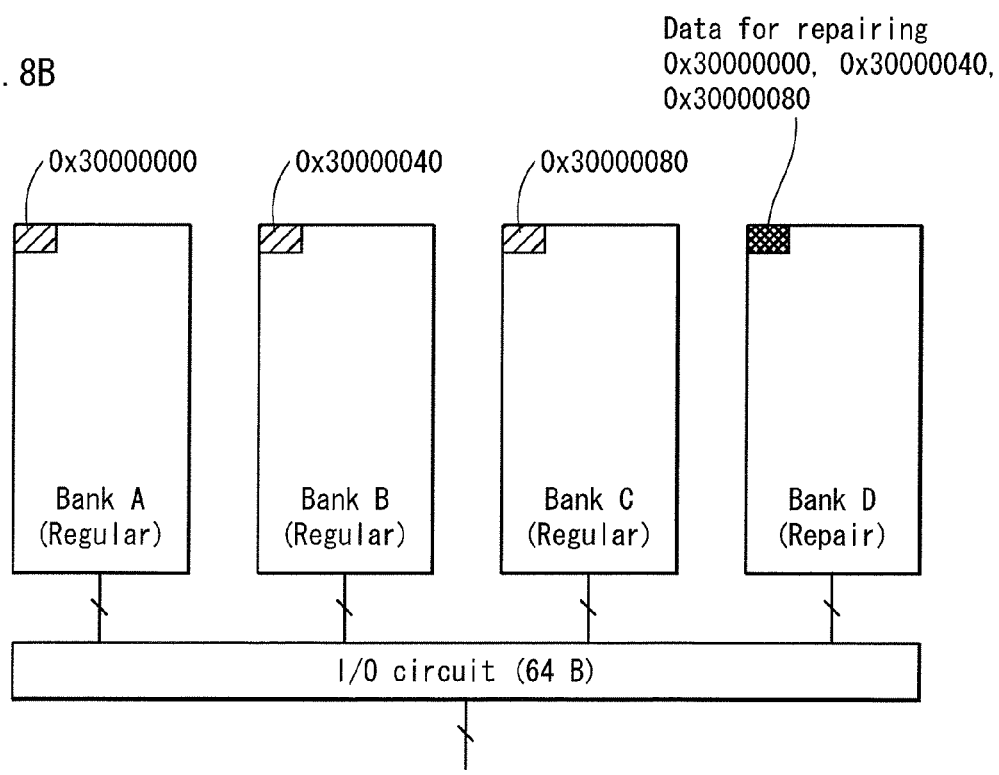
FIG. 8B is a schematic diagram illustrating the areas respectively storing data DTa, DTb, DTc and DTd.

FIG. 8B is a schematic diagram illustrating the areas respectively storing data DTa, DTb, DTc and DTd in the above example.

As illustrated in FIG. 8B, in the above example case, the starting physical address of the area storing data DTa is row address "0x000" and column address "0x00" of the bank A 310, the starting physical address of the area storing data DTb is row address "0x000" and column address "0x00" of the bank B 320, the starting physical address of the area storing data DTc is row address "0x000" and column address "0x00" of the bank C 330, and the starting physical address of the area storing data DTd is row address "0x000" and column address "0x00" of the bank D 340.

When a logical address is converted to a physical address in this repair, not the conversion rule illustrated in FIG. 4, but the following conversion rule is applied. That is to say, when a product of dividing a logical address by "0x0040" is a multiple of 3, the logical address is converted to a physical address of the bank A 310, when the product is "(a multiple of 3)+1", the logical address is converted to a physical address of the bank B 320, and when the product is "(a multiple of 3)+2", the logical address is converted to a physical address of the bank C 330. Similarly, the column address is a product of dividing by "0x0080", and the row address is a product of dividing by "'0x0080'×the number of columns'.

Back to FIG. 6, the description of the external memory control circuit 519 is continued.

The selector 603 is connected with the regular address converting unit 601, repair address converting unit 602, command issuance control unit 605, and redundancy repair circuit 520, and has the following function.

Function: to judge, based on the microbump IDs of defective-contact microbumps stored in the redundancy removal circuit 520, whether or not one or more defective-contact microbumps are present, and (1) when no defective-contact microbump is present, select a memory instruction sent from the regular address converting unit 601, and (2) when one or more defective-contact microbumps are present, select a memory instruction sent from the repair address converting unit 602, and output the selected memory instruction to the command queue 604.

The command queue 604 is connected with the selector 603 and command issuance control unit 605, and has a function to temporarily store the memory instruction output from the selector 603 until the instruction is read by the command issuance control unit 605.

The timing management unit 606 is connected with the command issuance control unit 605, and has a function to generate timing restriction information in sequence based on a predetermined condition, and store the generated timing restriction information, wherein the timing restriction information is used to identify one or more memory instructions that are currently issuable.

The command issuance control unit 605 is connected with the command queue 604, timing management unit 606, and memory chip 102, and has a function to refer to the timing restriction information stored in the timing management unit 606, read issuable memory instructions from among memory instructions temporarily stored in the command queue 604, and issue the read memory instructions, out of order, to the memory chip 102.

The data line redundancy repair unit 611 is connected with the memory chip 102, data reordering unit 612, data reordering unit 615, and redundancy repair circuit 520, and has the following four functions.

Function 1: to receive, from the memory chip 102, 64-B data read from the memory chip 102, refer to the microbump IDs of defective-contact microbumps stored in the redundancy removal circuit 520, judge whether or not one or more defective-contact microbumps are present, and when no defective-contact microbump is present, output the received data to the data reordering unit 612 as it is.

Function 2: to receive, from the memory chip 102, 64-B data read from the memory chip 102, refer to the microbump IDs of defective-contact microbumps stored in the redundancy removal circuit 520, judge whether or not one or more defective-contact microbumps are present, and when one or more defective-contact microbumps are present, extract bits from the received data at positions corresponding to the defective-contact microbumps, left-align the remaining bits of the data, and output the data after this arrangement to the data reordering unit 612.

Figure 9:
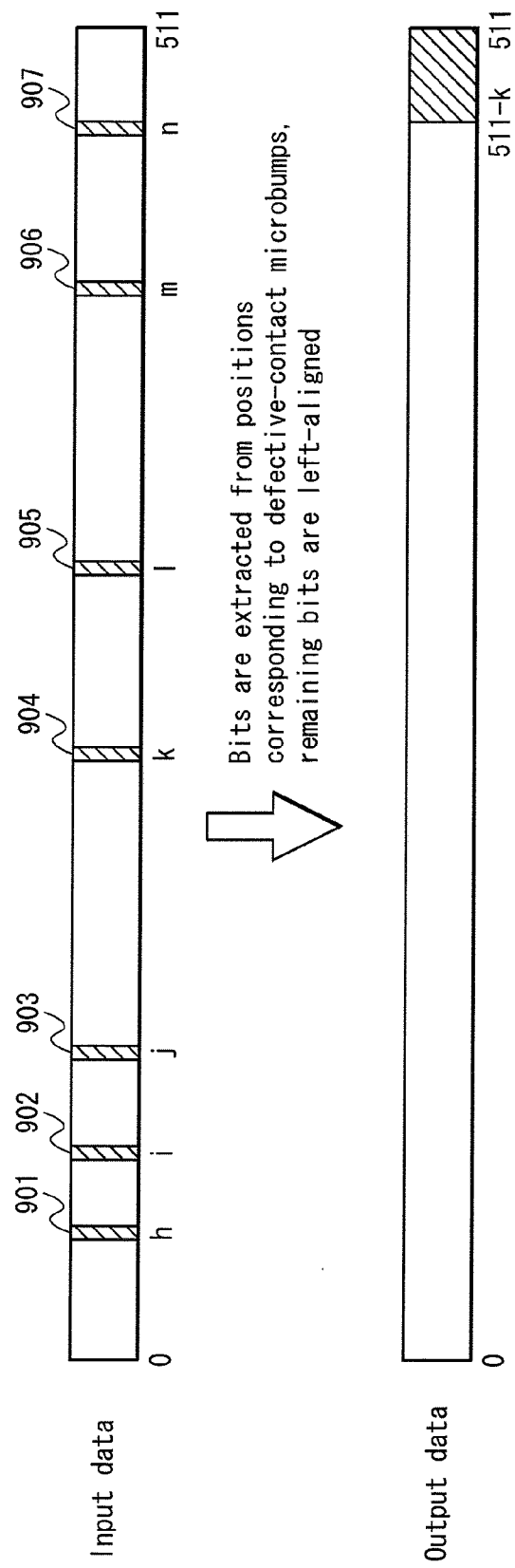
FIG. 9 is a schematic diagram 1 illustrating the relationship between input data and output data of the data line redundancy repair unit 611 when defective-contact microbumps are present.

FIG. 9 is a schematic diagram illustrating the relationship between input data and output data of the data line redundancy repair unit 611 when the input data is data having been read from the memory chip 102 and contains one or more defective-contact microbumps. FIG. 9 indicates an example where, among the input data that is 64-B (=512-bit) data, the $h^{th}$ bit 901, the $i^{th}$ bit 902, the $j^{th}$ bit 903, the $k^{th}$ bit 904, the $l^{th}$ bit 905, the $m^{th}$ bit 906, and the $n^{th}$ bit 907 are bits at positions corresponding to the defective-contact microbumps.

As illustrated in FIG. 9, the data line redundancy repair unit 611 extracts bits from the input data at positions corresponding to the defective-contact microbumps, left-aligns the remaining bits of the data, and outputs the data after this arrangement.

Back to FIG. 6, the description of the data line redundancy repair unit 611 is continued.

Function 3: to receive 64-B data sent from the data reordering unit 615, refer to the microbump IDs of defective-contact microbumps stored in the redundancy removal circuit 520, judge whether or not one or more defective-contact microbumps are present, and when no defective-contact microbump is present, output the received data to the memory chip 102 as it is.

Function 4: to receive 64-B data sent from the data reordering unit 615, refer to the microbump IDs of defective-contact microbumps stored in the redundancy removal circuit 520, judge whether or not one or more defective-contact microbumps are present, and when one or more defective-contact microbumps are present, insert dummy bits (for example, "0b0") to the received data at the positions corresponding to the defective-contact microbumps so that bits higher than the positions are shifted rightward, and output the data to the memory chip 102.

Figure 10:
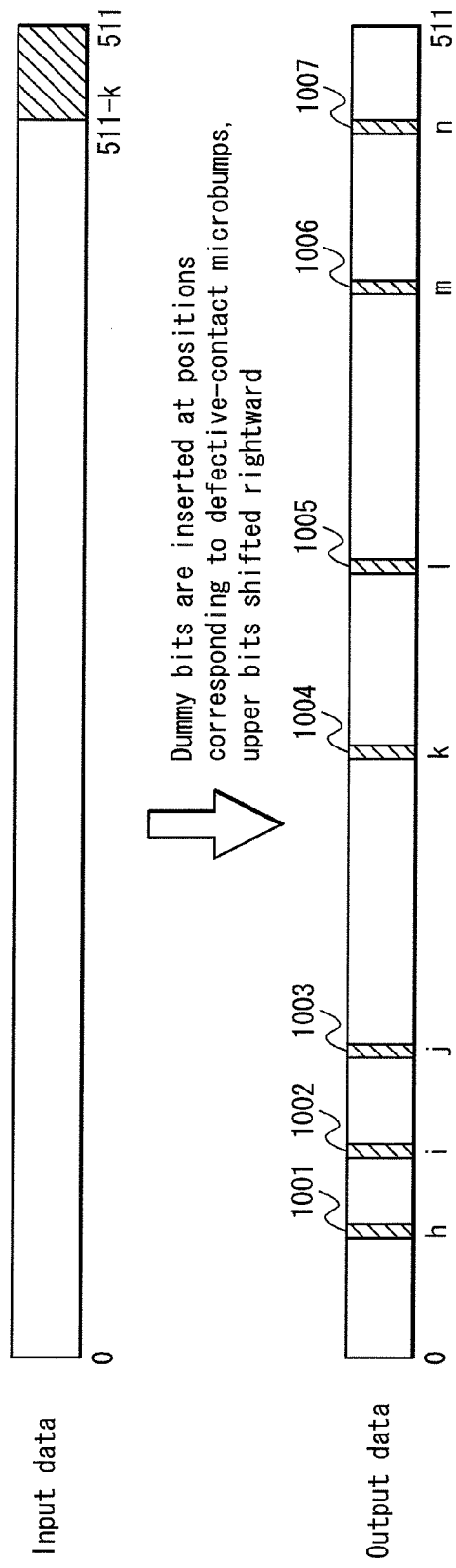
FIG. 10 is a schematic diagram 2 illustrating the relationship between input data and output data of the data line redundancy repair unit 611 when defective-contact microbumps are present.

FIG. 10 is a schematic diagram illustrating the relationship between input data and output data of the data line redundancy repair unit 611 when the input data is data having been sent from the data reordering unit 615 and contains one or more defective-contact microbumps. FIG. 10 indicates an example where, among the output data that is 64-B (=512-bit) data, the $h^{th}$ bit 1001, the $i^{th}$ bit 1002, the $j^{th}$ bit 1003, the $k^{th}$ bit 1004, the $l^{th}$ bit 1005, the $m^{th}$ bit 1006, and the $n^{th}$ bit 1007 are bits at positions corresponding to the defective-contact microbumps.

As illustrated in FIG. 10, the data line redundancy repair unit 611 inserts dummy bits at the positions corresponding to the defective-contact microbumps so that bits higher than the positions are shifted rightward, and outputs the data in which the dummy bits have been inserted.

Back to FIG. 6, the description of the external memory control circuit 519 is continued.

The data reordering unit 612 is connected with the data line redundancy repair unit 611 and attribute assigning unit 613 and has the following function.

Function: to, when the command issuance control unit 605 issues memory instructions out of order, and data, which has been read from the memory chip 102 in response to the out-of-order issued instructions, is sent from the data line redundancy repair unit 611, reorder the data so as to be in order and output the data to the attribute assigning unit 613.

The attribute assigning unit 613 is connected with the data reordering unit 612 and R data alignment buffer 614, and has a function of assigning an ID of a master, which reads the data, to the read data sent from the data reordering unit 612, wherein the ID of the master is assigned as attribute information, and outputting the data to the R data alignment buffer 614.

The R data alignment buffer 614 is connected with the attribute assigning unit 613 and redundancy repair circuit 520, and has the following five functions.

Function 1: to receive the read data from the attribute assigning unit 613, refer to the microbump IDs of defective-contact microbumps stored in the redundancy removal circuit 520, judge whether or not one or more defective-contact microbumps are present, and when no defective-contact microbump is present, output the received data to the data buffer 517 as it is.

Function 2: to receive the read data from the attribute assigning unit 613, refer to the microbump IDs of defective-contact microbumps stored in the redundancy removal circuit 520, judge whether or not one or more defective-contact microbumps are present, and when one or more defective-contact microbumps are present, temporarily store the received data.

Function 3: to determine the number of bits of defective-contact microbumps based on the microbump IDs of defective-contact microbumps stored in the redundancy removal circuit 520, and when k bits of defective-contact microbumps are present (k>0), receive read data (hereinafter referred to as "read data A") stored in the bank A 310 from the attribute assigning unit 613, wait until read data (hereinafter referred to as "read data D1"), which is stored in a storage area of the bank D specified by the same pair of row address and column address as the read data A, is received, and when the read data D1 is received, generate read data A1 by inserting a bit sequence [0:k] of the read data D1 into [(511−k):511] of the read data A, and output the generated read data A1 to the data buffer 517.

Function 4: to determine the number of bits of defective-contact microbumps based on the microbump IDs of defective-contact microbumps stored in the redundancy removal circuit 520, and when k bits of defective-contact microbumps are present (k>0), receive read data (hereinafter referred to as "read data B") stored in the bank B 320 from the attribute assigning unit 613, wait until read data (hereinafter referred to as "read data D2"), which is stored in a storage area of the bank D specified by the same pair of row address and column address as the read data B, is received, and when the read data D2 is received, generate read data B1 by inserting a bit sequence [128:(128+k)] of the read data D2 into [(511−k):511] of the read data B, and output the generated read data B1 to the data buffer 517.

Function 5: to determine the number of bits of defective-contact microbumps based on the microbump IDs of defective-contact microbumps stored in the redundancy removal circuit 520, and when k bits of defective-contact microbumps are present (k>0), receive read data (hereinafter referred to as "read data C") stored in the bank C 330 from the attribute assigning unit 613, wait until read data (hereinafter referred to as "read data D3"), which is stored in a storage area of the bank D specified by the same pair of row address and column address as the read data C, is received, and when the read data D3 is received, generate read data C1 by inserting a bit sequence [256:(256+k)] of the read data D3 into [(511−k):511] of the read data C, and output the generated read data C1 to the data buffer 517.

Figure 11:
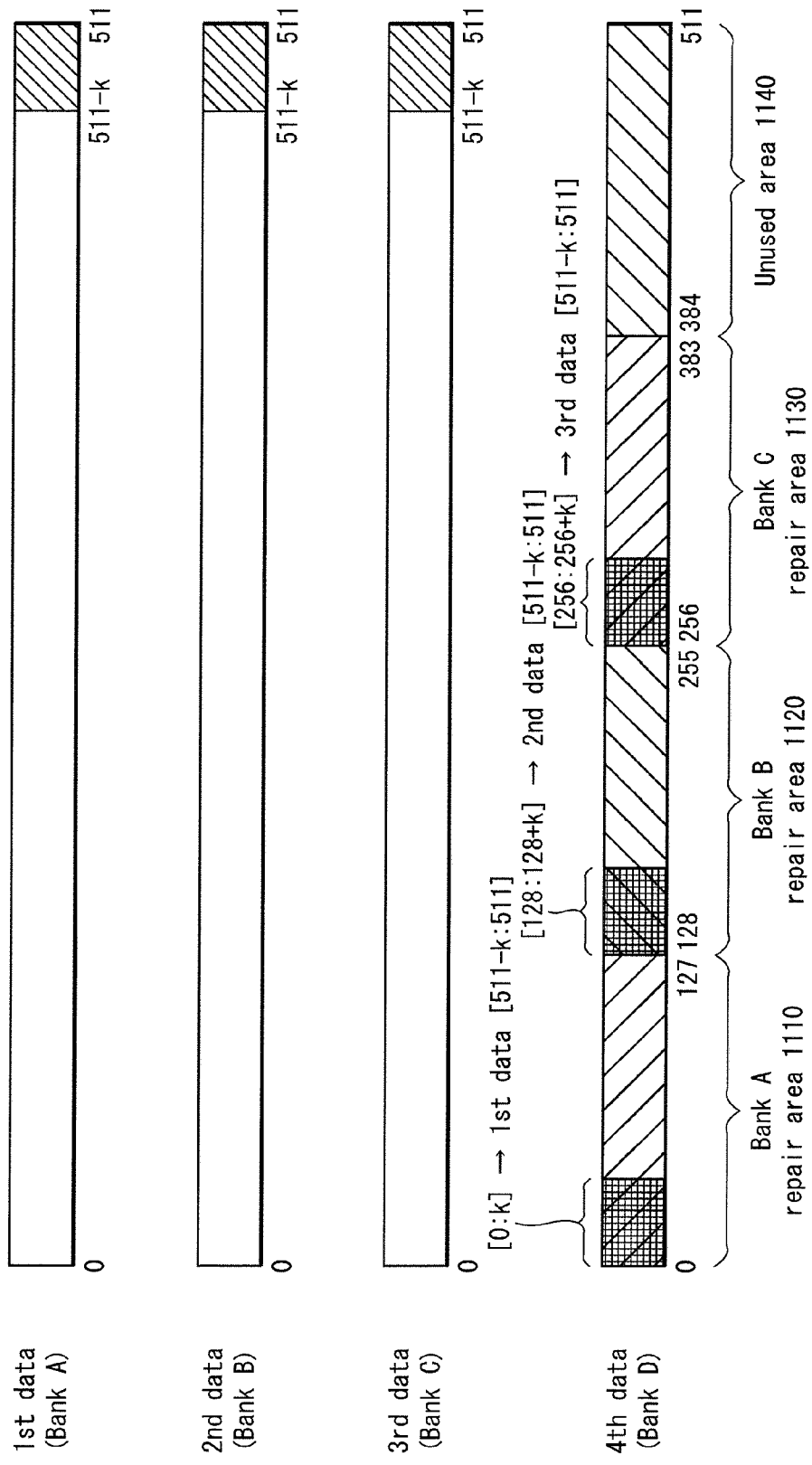
FIG. 11 is a schematic diagram illustrating a process performed by the R data alignment buffer 614 when defective-contact microbumps are present.

FIG. 11 is a schematic diagram illustrating a process performed by the R data alignment buffer 614 when k bits of defective-contact microbumps are present (k>0) and the R data alignment buffer 614 receives first data, second data, third data and fourth data that are read respectively from storage areas, each specified by the same pair of row address and column address, of the banks A 310, B 320, C 330 and D 340.

As illustrated in FIG. 11, the R data alignment buffer 614 inserts a bit sequence [0:k] of the fourth data into [(511−k):511] of the first data and outputs the resultant data, inserts a bit sequence [128:(128+k)] of the fourth data into [(511−k):511] of the second data and outputs the resultant data, and inserts a bit sequence [256:(256+k)] of the fourth data into [(511−k):511] of the third data and outputs the resultant data.

Back to FIG. 6, the description of the external memory control circuit 519 is continued.

The W data alignment buffer 616 is connected with the data reordering unit 615, data buffer 517 and redundancy repair circuit 520, and has the following three functions.

Function 1: to refer to the microbump IDs of defective-contact microbumps stored in the redundancy removal circuit 520, judge whether or not one or more defective-contact microbumps are present, and when no defective-contact microbump is present, output data received from the data buffer 517 to the data reordering unit 615 as it is.

Function 2: to refer to the microbump IDs of defective-contact microbumps stored in the redundancy removal circuit 520, judge whether or not one or more defective-contact microbumps are present, and when one or more defective-contact microbumps are present, temporarily store data received from the data buffer 517.

Function 3: to judge, based on the microbump IDs of defective-contact microbumps stored in the redundancy removal circuit 520, whether or not one or more defective-contact microbumps are present, and when k bits of defective-contact microbumps are present (k>0), and data to be written to the bank A 310 (hereinafter referred to as "writing data A") and/or data to be written to the bank B 320 (hereinafter referred to as "writing data B") and/or data to be written to the bank C 330 (hereinafter referred to as "writing data C") are sent from the data buffer 517 based on memory commands from one master, (1) generate, for each set of data, among the above writing data A to C, to be written to a storage area specified by the same pair of row address and column address, writing data D whose [0:k] is a bit sequence composed of [(511−k):511] of the writing data A, [128:(128+k)] is a bit sequence composed of [(511−k):511] of the writing data B, and [255:(255+k)] is a bit sequence composed of [(511−k):511] of the writing data C, and (2) output all of the received writing data and all of the generated writing data D to the data reordering unit 615.

Figure 12:
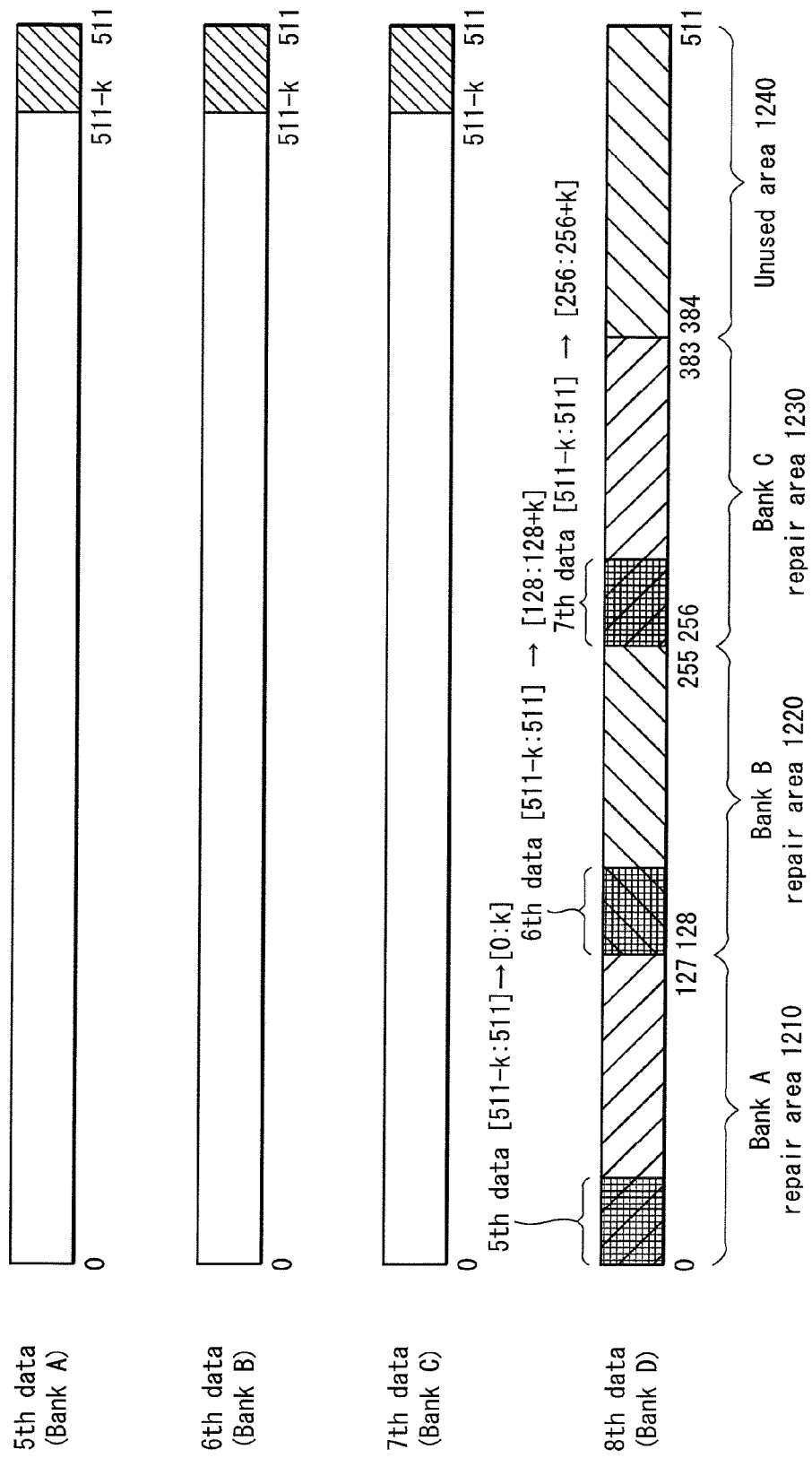
FIG. 12 is a schematic diagram illustrating a process performed by the W data alignment buffer 616 when defective-contact microbumps are present.

FIG. 12 is a schematic diagram illustrating a process performed by the W data alignment buffer 616 when k bits of defective-contact microbumps are present (k>0) and the W data alignment buffer 616 receives fifth data, sixth data and seventh data that are respectively to be written to storage areas, each specified by the same pair of row address and column address, of the banks A 310 B 320 and C 330 based on memory commands from one master.

As illustrated in FIG. 12, the W data alignment buffer 616 generates eighth data whose [0:k] is a bit sequence [(511−k):511] of the fifth data, [128:(128+k)] is a bit sequence [(511−k):511] of the sixth data, and [255:(255+k)] is a bit sequence [(511−k):511] of the seventh data, and outputs the fifth data, sixth data, seventh data and eighth data.

Back to FIG. 6, the description of the external memory control circuit 519 is continued.

The data reordering unit 615 is connected with the W data alignment buffer 616 and data line redundancy repair unit 611, and has the following function.

Function: to, when the command issuance control unit 605 issues memory instructions out of order, and data, which is to be written to the memory chip 102 in response to the out-of-order issued memory instructions, is sent from the W data alignment buffer 616, reorder the data so as to be aligned in an order of issuance of the instructions, and output the reordered data to the data line redundancy repair unit 611.

The following describes the operation of the integrated circuit 100 with the above-described structure, with reference to the drawings.

<Operation>

Here, among a plurality of operations performed by the integrated circuit 100, two characteristic operations: a memory command arbitration process; and a memory chip control process, are described.

<Memory Command Arbitration Process>

The memory command arbitration process is a process performed by the memory access controller 510 in which it receives master-issued memory commands from the first master 501 through $n^{th}$ master 503 and arbitrates among the received memory commands.

In the following explanation, for the sake of simplification, the first master 501 is used as the representative of the first master 501 through $n^{th}$ master 503, and the first master interface 511 is used as the representative of the first master interface 511 through $n^{th}$ master interface 513.

Figure 13:
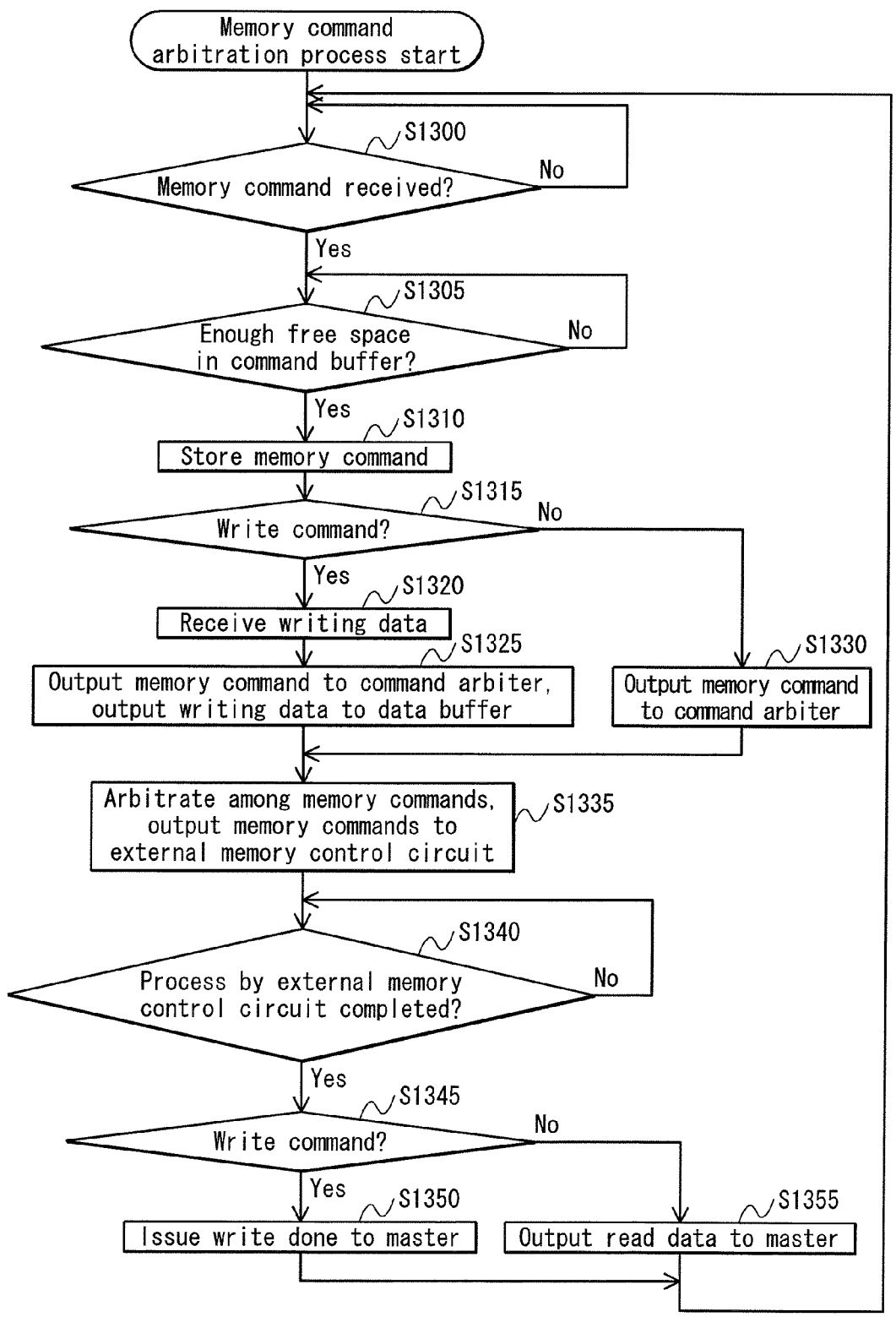
FIG. 13 is a flowchart of the memory command arbitration process.

FIG. 13 is a flowchart of the memory command arbitration process.

The memory command arbitration process is started as the memory access controller 510 is activated.

When the memory command arbitration process is started, the first master interface 511 waits until it receives a master-issued memory command from the first master 501 (step S1300: "No" is repeated). When it receives a master-issued memory command (step S1300: Yes), the first master interface 511 judges whether or not there is enough free space to store the received master-issued memory command in the internal command buffer (step S1305).

When it judges that there is not enough free space to store the master-issued memory command (step S1305: No), the first master interface 511 waits until there is enough free space to store the master-issued memory command in the internal command buffer (step S1305: "No" is repeated). When it judges that there is enough free space to store the master-issued memory command (step S1305: Yes), the first master interface 511 temporarily stores the master-issued memory command into the internal command buffer (step S1310).

After storing the master-issued memory command, the first master interface 511 judges whether or not the stored master-issued memory command is a write command instructing to write data to the memory chip 102 (step S1315).

When it is judged that the stored master-issued memory command is a write command instructing to write data to the memory chip 102 (step S1315: Yes), the first master interface 511 receives writing data that is to be written to a storage area in the memory chip 102, the writing data having been sent from the first master 501 (step S1320). The first master interface 511 then outputs the master-issued memory command, which is temporarily stored in the internal buffer, to the command arbiter 516, and outputs the received writing data to the data buffer 517 (step S1325).

When it is judged that the stored master-issued memory command is not a write command instructing to write data to the memory chip 102, but a read command instructing to read data from the memory chip 102 (step S1315: No), the first master interface 511 outputs the master-issued memory command, which is temporarily stored in the internal buffer, to the command arbiter 516 (step S1330).

With the performance of step S1325 or S1330, the command arbiter 516 receives a master-issued memory command from the first master interface 511.

The command arbiter 516 also receives master-issued memory commands in parallel from the second master interface 512 through $n^{th}$ master interface 513, as well as from the first master interface 511.

The command arbiter 516 arbitrates among the plurality of master-issued memory commands by assigning priorities to them (step S1335), and outputs the master-issued memory commands in sequence to the external memory control circuit 519 in a descending order of the assigned priorities (in an order from the highest to the lowest priority).

Each time upon receiving a master-issued memory command from the command arbiter 516, the external memory control circuit 519 performs a process corresponding to the received command. The process performed by the external memory control circuit 519 is described in detail in <Memory chip control process> below.

After outputting the master-issued memory commands to the external memory control circuit 519, the command arbiter 516 waits until the external memory control circuit 519 completes a process corresponding to a master-issued memory command (step S1340: "No" is repeated).

When it is judged that the external memory control circuit 519 has completed a process corresponding to a master-issued memory command (step S1340: Yes), the command arbiter 516 checks whether or not the master-issued memory command is a write command (step S1345).

When it is judged that the master-issued memory command is a write command (step S1345: Yes), the command arbiter 516 outputs a write done signal, which indicates that the write command has been completed, to the master that issued the master-issued memory command, via a corresponding master interface (step S1350).

When it is judged that the master-issued memory command is not a write command, but a read command (step S1345: No), the data buffer 517 receives data, which was read from a storage area of the memory chip 102 and has been sent from the external memory control circuit 519, and outputs the received data to the master that issued the master-issued memory command, via a corresponding master interface (step S1355).

After completion of the process in step S1350 or S1355, the memory access controller 510 returns to the process in step S1300 and repeats the processes onwards.

<Memory Chip Control Process>

The memory chip control process is a process performed by the external memory control circuit 519 in which it writes data to or reads data from the memory chip 102 by receiving a master-issued memory command from the command arbiter 516, converting the master-issued memory command to a memory instruction that can be used by the memory chip 102, and issuing the memory instruction to the memory chip 102.

Figure 14:
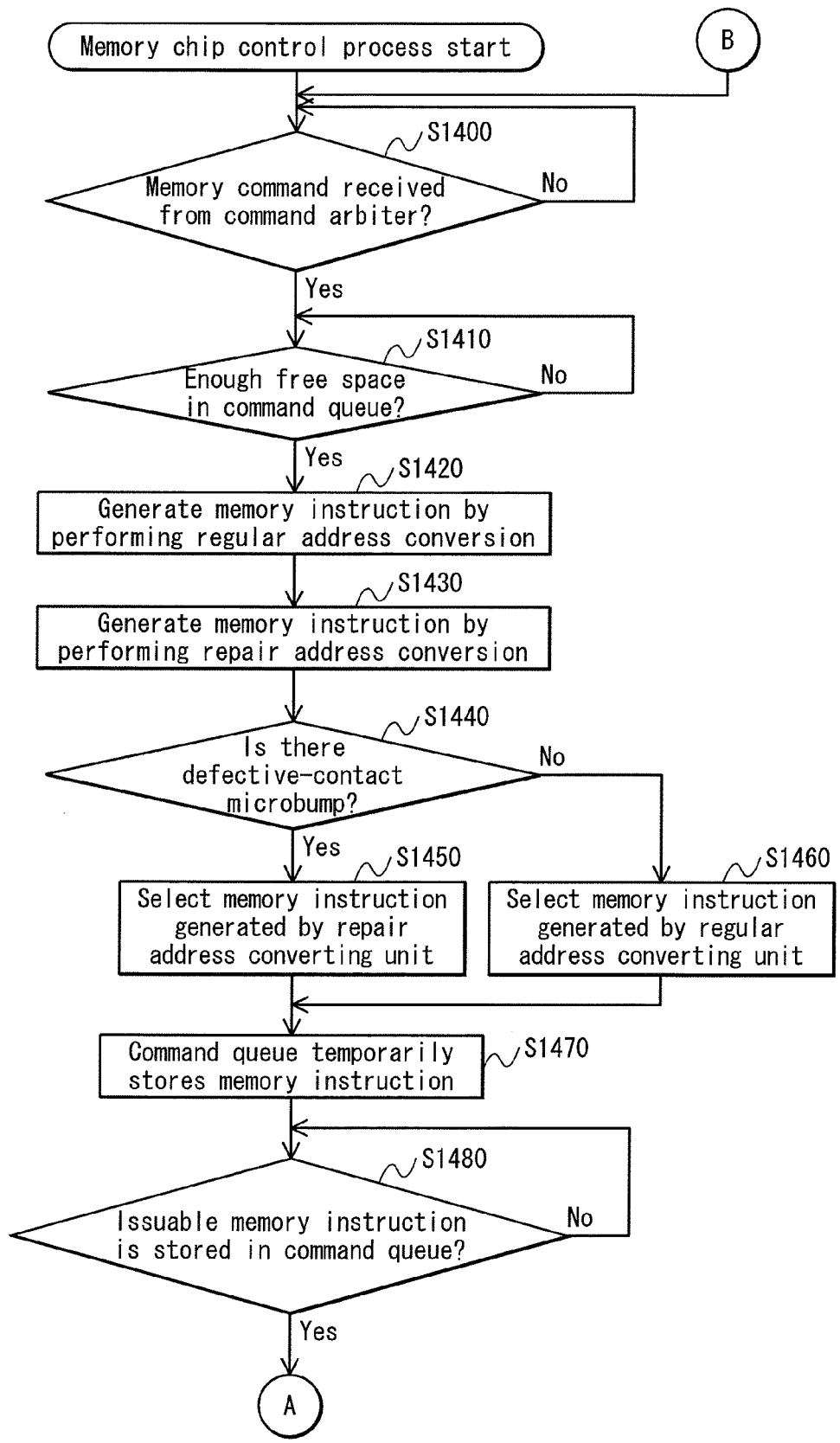
FIG. 14 is a flowchart 1 of the memory chip control process.
Figure 15:
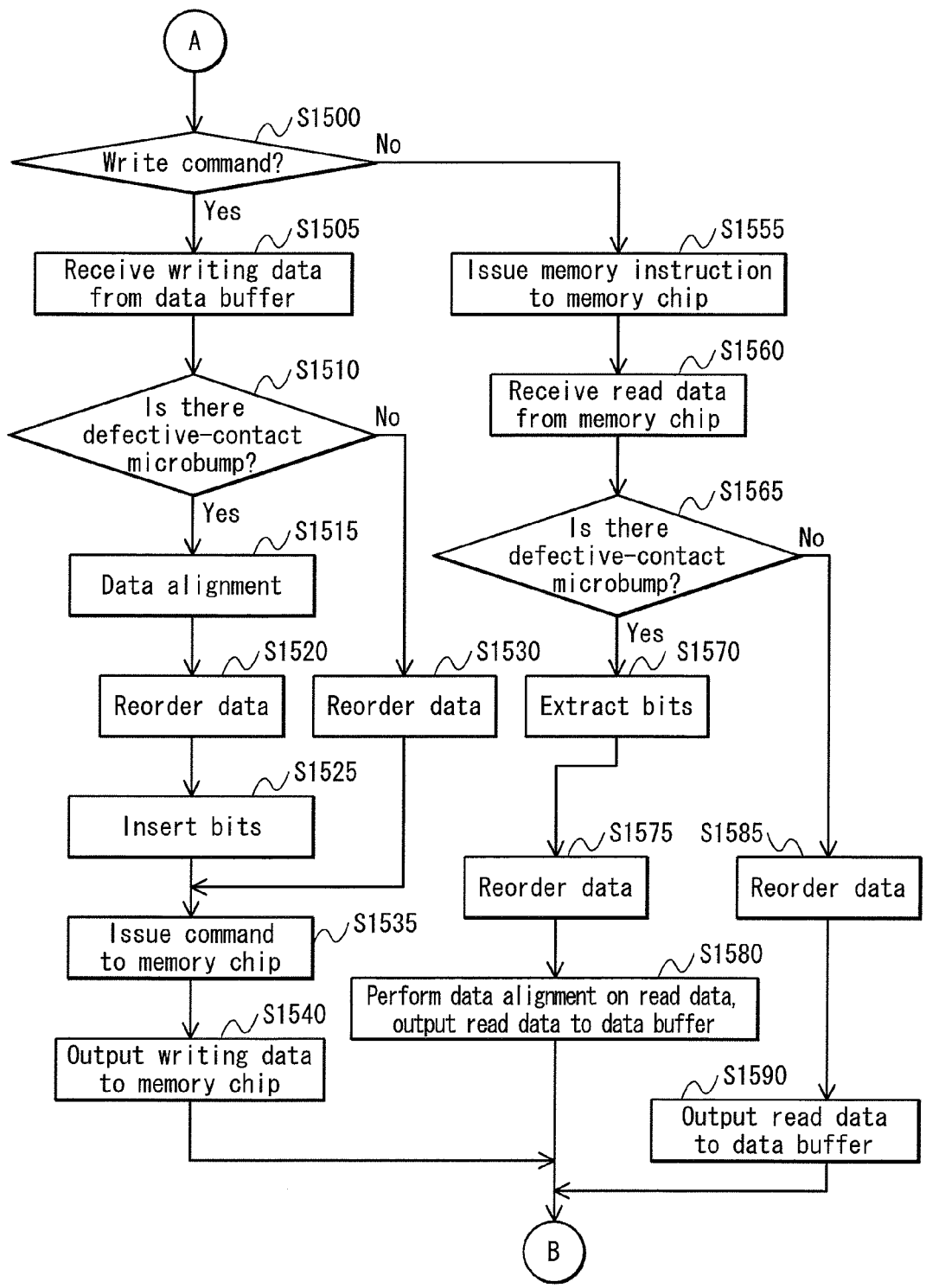
FIG. 15 is a flowchart 2 of the memory chip control process.

FIGS. 14 and 15 are flowcharts of the memory chip control process.

The memory chip control process is started when the external memory control circuit 519 is activated.

When the memory chip control process is started, the external memory control circuit 519 waits until it receives a master-issued memory command from the command arbiter 516 (step S1400: "No" is repeated). When it receives a master-issued memory command (step S1400: Yes), the external memory control circuit 519 judges whether or not there is enough free space to store the received master-issued memory command in the command queue 604 (step S1410).

When it judges that there is not enough free space to store the master-issued memory command (step S1410: No), the external memory control circuit 519 waits until there is enough free space to store the master-issued memory command in the command queue 604 (step S1410: "No" is repeated). When it judges that there is enough free space to store the master-issued memory command (step S1410: Yes), (1) the regular address converting unit 601 converts a logical address, which specifies an m-bit storage area included in the master-issued memory command received from the command arbiter 516, to a physical address which specifies an m-bit storage area in the 256-MB storage area composed of banks A 310, B 320, C 330 and D 340 in the memory chip 102, converts a memory access instruction included in the master-issued memory command received from the command arbiter 516, to a memory instruction that can be used by the memory chip 102 by using the converted physical address, and outputs the memory instruction to the selector 603 (step S1420), and (2) the repair address converting unit 602 converts a logical address, which specifies an m-bit storage area included in the master-issued memory command received from the command arbiter 516, to (i) a physical address which specifies an m-bit storage area in the 192-MB storage area composed of banks A 310, B 320 and C 330 in the memory chip 102, and (ii) a physical address which specifies a k-bit storage area in the 64-MB storage area composed of bank D 340 in the memory chip 102, converts a memory access instruction included in the master-issued memory command received from the command arbiter 516, to a memory instruction that can be used by the memory chip 102 by using the converted physical addresses, and outputs the memory instruction to the selector 603 (step S1430).

Upon receiving the memory instructions from the regular address converting unit 601 and repair address converting unit 602, the selector 603 refers to the microbump IDs of defective-contact microbumps stored in the redundancy removal circuit 520 and judges whether or not one or more defective-contact microbumps are present (step S1440).

When it is judged that one or more defective-contact microbumps are present (step S1440: Yes), the selector 603 selects the memory instruction generated by the repair address converting unit 602 and outputs the selected memory instruction to the command queue 604 (step S1450).

When it is judged that no defective-contact microbump is present (step S1440: No), the selector 603 selects the memory instruction generated by the regular address converting unit 601 and outputs the selected memory instruction to the command queue 604 (step S1460).

With the performance of step S1450 or S1460, the command queue 604 receives a memory instruction and temporarily stores the received memory instruction (step S1470).

When the command queue 604 temporarily stores the memory instruction, the command issuance control unit 605 refers to the timing restriction information stored in the timing management unit 606 and judges whether or not an issuable memory instruction is present in memory instructions temporarily stored in the command queue 604 (step S1480).

When it is judged that no issuable memory instruction is present (step S1480: No), the command issuance control unit 605 waits until an issuable memory instruction is present (step S1480: "No" is repeated).

When it is judged that an issuable memory instruction is present (step S1480: Yes), the command issuance control unit 605 judges whether or not the issuable memory instruction is a write command instructing to write data to the memory chip 102 (step S1500).

When it is judged that the issuable memory instruction is a write command (step S1500: Yes), the W data alignment buffer 616 receives writing data to be written to the memory chip 102 from the data buffer 517 (step S1505).

Upon receiving the writing data, the W data alignment buffer 616 refers to the microbump IDs of defective-contact microbumps stored in the redundancy removal circuit 520 and judges whether or not one or more defective-contact microbumps are present (step S1510).

When it is judged that one or more defective-contact microbumps are present (step S1510: Yes) and when k bits of defective-contact microbumps are present (k>0), the W data alignment buffer 616 temporarily stores writing data until writing data A to be written to the bank A 310 and/or writing data B to be written to the bank B 320 and/or writing data C to be written to the bank C 330 are sent from the data buffer 517 based on a memory command issued from one master, and (1) generates, for each set of data, among the above writing data A to C, to be written to a storage area specified by the same pair of row address and column address, writing data D whose [0:k] is a bit sequence composed of [(511−k):511] of the writing data A, [128:(128+k)] is a bit sequence composed of [(511−k):511] of the writing data B, and [255:(255+k)] is a bit sequence composed of [(511−k):511] of the writing data C, and (2) outputs all of the received writing data and all of the generated writing data D to the data reordering unit 615 (step S1515).

Upon receiving writing data from the W data alignment buffer 616, the data reordering unit 615 reorders the writing data as necessary and outputs the reordered data to the data line redundancy repair unit 611 (step S1520).

Upon receiving writing data from the data reordering unit 615, the data line redundancy repair unit 611, since one or more defective-contact microbumps are present, inserts dummy bits (for example, "0b0") to the received writing data at the positions corresponding to the defective-contact microbumps based on the microbump IDs of defective-contact microbumps stored in the redundancy removal circuit 520 so that bits higher than the positions are shifted rightward, and outputs the data to the memory chip 102 (step S1525).

When it is judged that no defective-contact microbump is present (step S1510: No), the W data alignment buffer 616 outputs the data received from the data buffer 517 to the data reordering unit 615 as it is. Upon receiving the writing data from the W data alignment buffer 616, the data reordering unit 615 reorders the writing data as necessary and outputs the reordered data to the data line redundancy repair unit 611. Since no defective-contact microbump is present, the data line redundancy repair unit 611 does not insert dummy bits to the writing data received from the data reordering unit 615 (step S1530).

After completion of the process in step S1525 or S1530, the command issuance control unit 605 issues a write command instructing to write data to the memory chip 102 (step S1535), and the data line redundancy repair unit 611 outputs writing data to the memory chip 102 (step S1540).

When it is judged that the issuable memory instruction is not a write command, but a read command (step S1500: No), the command issuance control unit 605 issues a read command instructing to read data from the memory chip 102 (step S1555).

Subsequently, the memory chip 102 reads data in accordance with the read data and outputs the read data to the data line redundancy repair unit 611, and the data line redundancy repair unit 611 receives the read data from the memory chip 102 (step S1560).

Upon receiving the read data from the memory chip 102, the data line redundancy repair unit 611 refers to the microbump IDs of defective-contact microbumps stored in the redundancy removal circuit 520 and judges whether or not one or more defective-contact microbumps are present (step S1565).

When it is judged that one or more defective-contact microbumps are present (step S1565: Yes), the data line redundancy repair unit 611 extracts bits from the received read data at positions corresponding to the defective-contact microbumps, left-aligns the remaining bits of the data, and outputs the data after this arrangement to the data reordering unit 612 (step S1570).

Upon receiving read data from the data line redundancy repair unit 611, the data reordering unit 612 reorders the read data as necessary and outputs the reordered data to the attribute assigning unit 613 (step S1575), and the attribute assigning unit 613 assigns an ID of a master, which reads the data, to the read data sent from the data reordering unit 612, wherein the ID of the master is assigned as attribute information, and outputs the data to the R data alignment buffer 614.

Since one or more defective-contact microbumps are present, when k bits of defective-contact microbumps are present (k>0), upon receiving the read data from the data reordering unit 612, the R data alignment buffer 614 (1) waits until read data (hereinafter referred to as "read data D1") that has been stored in a storage area of the bank D specified by the same pair of row address and column address as the read data A is received, and when the read data D1 is received, generates read data A1 by inserting a bit sequence composed of [0:k] of the read data D1 into [(511−k):511] of the read data A, and outputs the generated read data A1 to the data buffer 517, (2) waits until read data (hereinafter referred to as "read data D2") stored in a storage area of the bank D specified by the same pair of row address and column address as the read data B is received, and when the read data D2 is received, generates read data B1 by inserting a bit sequence composed of [128:(128+k)] of the read data D2 into [(511−k):511] of the read data B, and outputs the generated read data B1 to the data buffer 517, and (3) waits until read data (hereinafter referred to as "read data D3") stored in a storage area of the bank D specified by the same pair of row address and column address as the read data C is received, and when the read data D3 is received, generates read data C1 by inserting a bit sequence composed of [256:(256+k)] of the read data D3 into [(511−k):511] of the read data C, and outputs the generated read data C1 to the data buffer 517 (step S1580).

When it is judged that no defective-contact microbump is present (step S1565: No), the data line redundancy repair unit 611 outputs the received read data to the data reordering unit 612 as it is. Upon receiving the read data from the data line redundancy repair unit 611, the data reordering unit 612 reorders the read data as necessary and outputs the reordered data to the attribute assigning unit 613. The attribute assigning unit 613 assigns an ID of a master, which requested to read the data, to the read data sent from the data reordering unit 612, wherein the ID of the master is assigned as attribute information, and outputs the data to the R data alignment buffer 614 (step S1585).

Since no defective-contact microbump is present, upon receiving the read data from the attribute assigning unit 613, the R data alignment buffer 614 outputs the received read data to the data buffer 517 as it is (step S1590).

After completion of the process in step S1540, S1580 or S1590, the external memory control circuit 519 returns to the process in step S1400 and repeats the processes onwards.

The following considers the integrated circuit 100.
<Consideration 1>

According to the above-described integrated circuit 100, when no defective-contact microbump is present, each master included in the system LSI chip 101 uses the 256-MB storage area composed of the banks A 310, B 320, C 330 and D 340. This integrated circuit 100 operates as a good-quality product for high functionality.

Also, even if the memory data microbump group has 128 or less defective-contact microbumps, each master included in the system LSI chip 101 can use the 192-MB storage area composed of the banks A 310, B 320 and C 330. In this case, the 64-MB storage area composed of the bank D 340 is used to repair a storage area that cannot be accessed due to the presence of the defective-contact microbumps, among the 192-MB storage area composed of the banks A 310, B 320 and C 330. It should be noted here however that, compared to the case where no defective-contact microbump is present, the ratio of the number of memory instructions issued by the external memory control circuit 519 to the amount of used memory areas increases, and thus, compared to the case where no defective-contact microbump is present, the use efficiency of the memory chip 102 by the masters included in the system LSI chip 101 decreases. Also the used storages areas decrease. However, this integrated circuit 100 operates as a good-quality product for popular use.

On the other hand, in a conventional integrated circuit, a logic chip, which does not include the memory access controller 510, and a memory chip are connected with each other via microbumps, and if merely one defective-contact microbump is present, the conventional integrated circuit cannot operate correctly, and thus is a defective product.

Therefore, compared to the conventional integrated circuits, the integrated circuit 100 reduces the frequency of occurrence of defective product due to presence of a defective-contact microbump.

The following describes a manufacturing method of the above-described integrated circuit 100, with reference to the drawings.

<Manufacturing Method>

Figure 16:
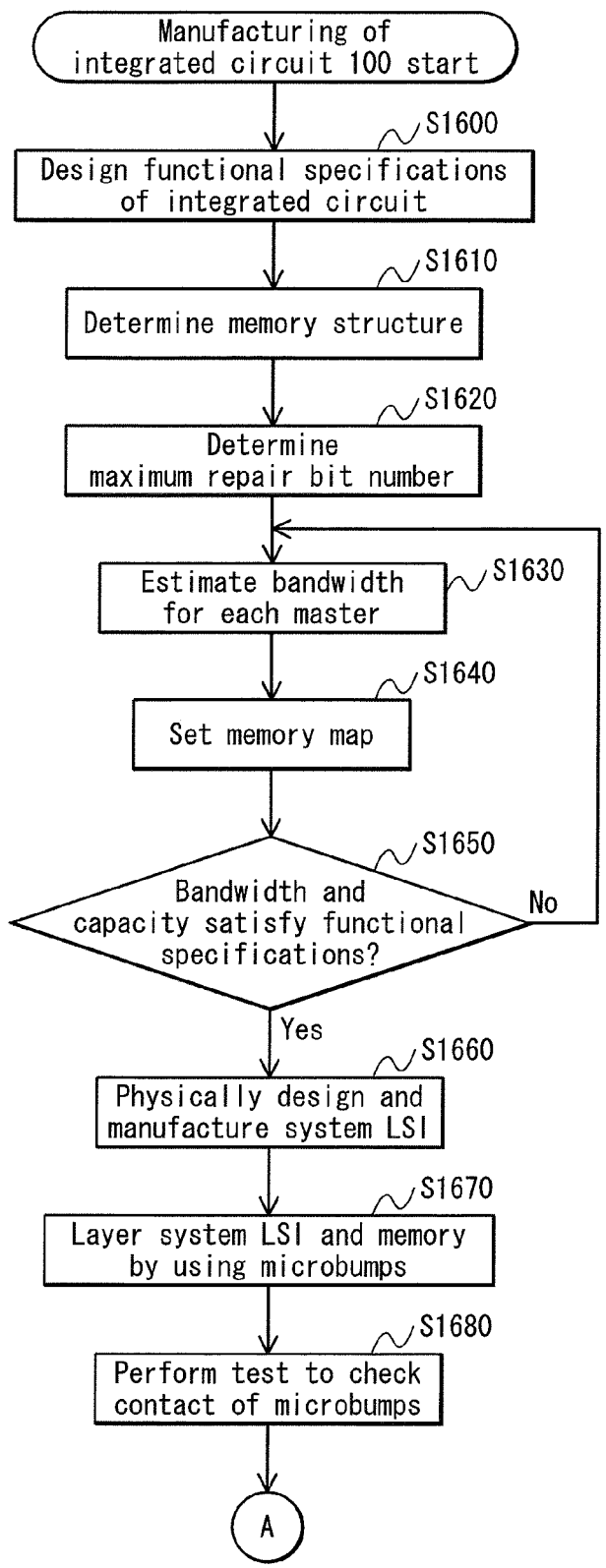
FIG. 16 is a flowchart 1 of the manufacturing method of the integrated circuit 100.
Figure 17:
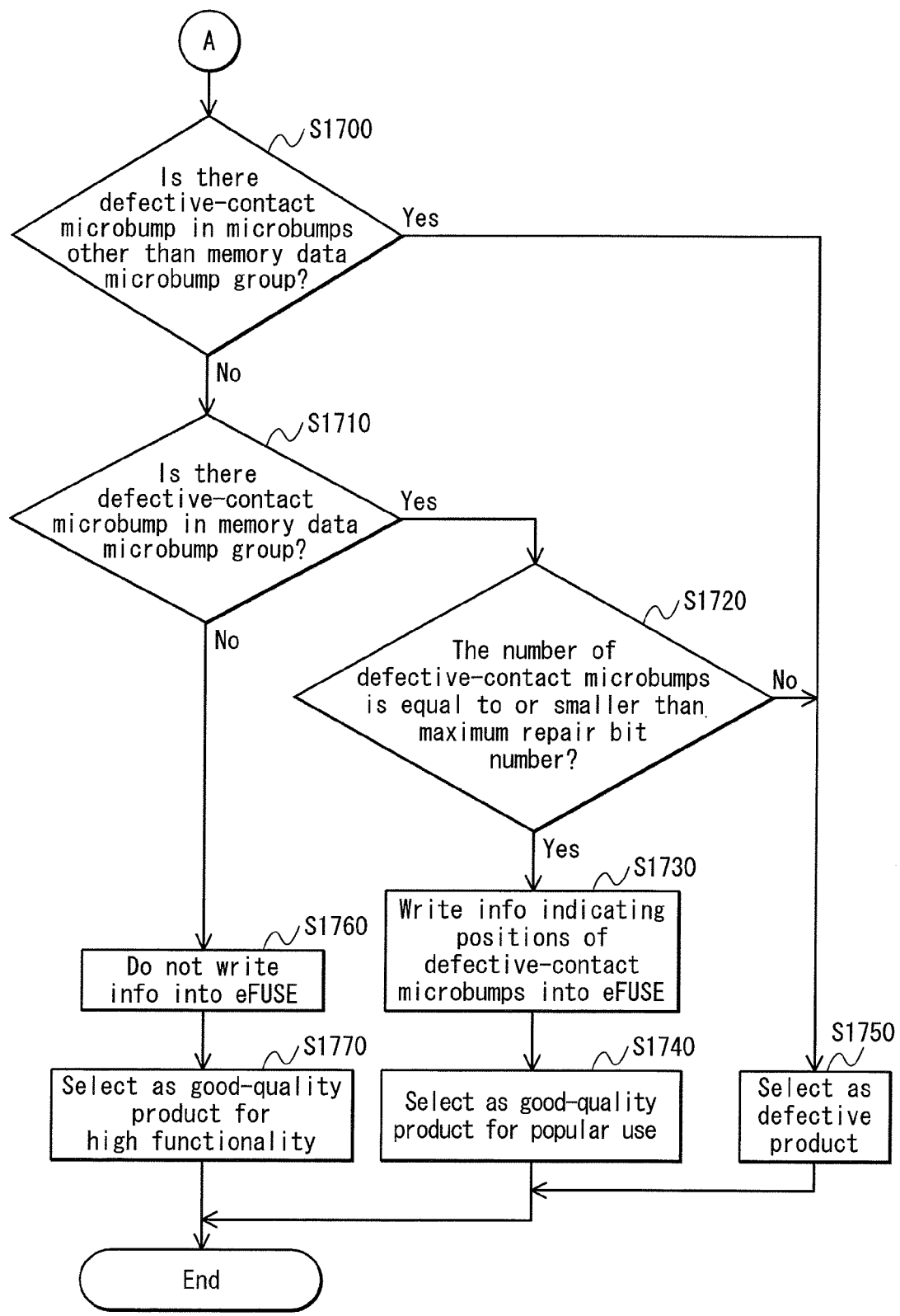
FIG. 17 is a flowchart 2 of the manufacturing method of the integrated circuit 100.

FIGS. 16 and 17 are flowcharts of the manufacturing method of the integrated circuit 100.

The manufacturing of the integrated circuit 100 is started when the integrated circuit 100 starts to be developed.

When the integrated circuit 100 starts to be developed, first the functional specifications of the integrated circuit 100 are designed (step S1600). Subsequently, the memory structure is determined (step S1610).

Based on the estimates of the cost, yield and the like of the integrated circuit 100 that are obtained in the design of the functional specifications, the maximum number of bits of the defective-contact microbumps that, if they occur, can be repaired as the good-quality product for popular use, is determined (hereinafter the maximum number of bits is referred to as "maximum repair bit number") (step S1620).

After the determination of the maximum repair bit number, a memory bandwidth for communication from the masters to the memory chip 102 when the circuit operates as a good-quality product for high functionality, and a memory bandwidth for communication from the masters to the memory chip 102 when the circuit operates as a good-quality product for popular use, are estimated (step S1630). Subsequently, a memory map for the case of operating as a good-quality product for high functionality and a memory map for the case of operating as a good-quality product for popular use, are determined (step S1640). Here, the determination of a memory map means to determine, for each master, a memory space (=logical address space) to be used by the master.

After the determination of the memory maps, it is judged whether or not the memory bandwidth for the memory chip 102 and the memory capacity of the memory chip 102 satisfy the requirements for the memory structure determined in step S1610 (step S1650).

When it is judged that the memory bandwidth and the memory capacity do not satisfy the requirements for the memory structure (step S1650: No), the processes in steps S1630 through S1650 are repeatedly performed until the memory bandwidth and the memory capacity satisfy the requirements for the memory structure. Here, the control may return even to the process in step S1600 or S1610 depending on the level at which the memory bandwidth and the memory capacity do not satisfy the requirements for the memory structure.

When it is judged that the memory bandwidth and the memory capacity satisfy the requirements for the memory structure (step S1650: Yes), the system LSI chip 101 is physically designed and the system LSI chip 101 is manufactured (step S1660), and the memory chip 102 is bought (or manufactured).

The integrated circuit 100 is assembled by layering a good product among the manufactured system LSI chips 101 and a good product among the bought (or manufactured) memory chips 102 (step S1670).

After this, the assembled integrated circuit 100 undergoes a test in which an LSI tester is uded to check whether or not a defective-contact microbump is present (step S1680). More specifically, in this test, the integrated circuit 100 is caused to execute, by using the LSI tester, a test vector which includes a data read command group or a data write command group from the system LSI chip 101 to the memory chip 102.

Subsequently, it is checked, by analyzing the test results, whether or not microbumps other than microbumps of the memory data microbump group include one or more defective-contact microbumps (step S1700).

When it is judged that microbumps other than microbumps of the memory data microbump group do not include a defective-contact microbump (step S1700: No), it is checked, by further analyzing the test results, whether or not microbumps of the memory data microbump group include one or more defective-contact microbumps (step S1710).

When it is judged that microbumps of the memory data microbump group include one or more defective-contact microbumps (step S1710: Yes), it is checked whether or not the number of defective-contact microbumps is equal to or smaller than the maximum repair bit number (step S1720).

When it is judged that the number of defective-contact microbumps is equal to or smaller than the maximum repair bit number (step S1720: Yes), the eFUSE circuit 521 is caused to, by using the LSI tester, store the microbumps IDs of the defective-contact microbumps (step S1730). Subsequently, the integrated circuit 100 is selected as a good-quality product for popular use for which 7 GB/s of memory bandwidth is secured (step S1740).

When it is judged that microbumps other than microbumps of the memory data microbump group include a defective-contact microbump (step S1700: Yes), or when it is judged that the number of defective-contact microbumps is greater than the maximum repair bit number (step S1720: No), the integrated circuit 100 is selected as a defective product (step S1750).

When it is judged that microbumps of the memory data microbump group do not include a defective-contact microbump (step S1710: No), no information is stored in the eFUSE circuit 521 (step S1760). Subsequently, the integrated circuit 100 is selected as a good-quality product for high functionality for which 10 GB/s of memory bandwidth is secured (step S1770).

After completion of the process in step S1740, S1750, or S1770, the manufacturing of the integrated circuit 100 ends.

<Consideration 2>

In the integrated circuit 100 selected as a good-quality product for popular use, the memory data microbump group includes one or more defective-contact microbumps. As a result, part of data read from the memory chip 102 cannot be used effectively. Accordingly, to read a certain amount of effective data from the memory chip 102, the integrated circuit 100 selected as a good-quality product for popular use is required to read data from the memory chip 102 more number of times than the integrated circuit 100 selected as a good-quality product for high functionality (namely, an integrated circuit 100 in which no defective-contact microbump is present).

As a result, when executing a process including a process of reading data from the memory chip 102, the memory chip 102 of the integrated circuit 100 selected as a good-quality product for popular use consumes a larger amount of electricity than the memory chip 102 of the integrated circuit 100 selected as a good-quality product for high functionality.

Also, it is known in general that a pattern including a characteristic peak is observed as a time-varying pattern of electricity consumption in the case where a memory reads data.

This is because, in general, characteristic periods in which a relatively larger amount of current flows than the other periods, such as a precharge period in which the bit lines are precharged, and a sense amplifier operation period in which a plurality of sense amplifiers are operated in parallel, are present in a sequence of operations performed by the memory to read data.

It is thus possible to estimate the number of times the memory reads data, by detecting the number of times the above pattern including the characteristic peak appears as the time-varying pattern of electricity consumption in the case where a memory reads data.

It is thus possible to determine, by estimating the number of times the memory chip 102 reads data when an integrated circuit 100 performs a certain process, whether or not the integrated circuit 100 has been selected as a good-quality product for popular use or as a good-quality product for high functionality.

With regard to data writing, similar to data reading, when executing a process including a process of writing data to the memory chip 102, the memory chip 102 of the integrated circuit 100 selected as a good-quality product for popular use consumes a larger amount of electricity than the memory chip 102 of the integrated circuit 100 selected as a good-quality product for high functionality.

Also, it is known in general that a pattern including a characteristic peak is observed as a time-varying pattern of electricity consumption in the case where a memory writes data.

This is because, in general, characteristic periods in which a relatively larger amount of current flows than the other periods, such as a memory cell writing period in which the bit lines are driven in parallel to write data to memory cells, are present in a sequence of operations performed by the memory to write data.

It is thus possible to estimate the number of times the memory writes data, by detecting the number of times the above pattern including the characteristic peak appears as the time-varying pattern of electricity consumption in the case where a memory writes data.

It is thus possible to determine, by estimating the number of times the memory chip 102 writes data when an integrated circuit 100 performs a certain process, whether or not the integrated circuit 100 has been selected as a good-quality product for popular use or as a good-quality product for high functionality.

Embodiment 2

Outline

The following describes, as one example of a memory access control device of the present invention, a first-modification integrated circuit which is obtained by modifying a part of the integrated circuit 100 of Embodiment 1.

In the integrated circuit 100 of Embodiment 1, the system LSI chip 101 includes the redundancy repair circuit 520 that includes the eFUSE circuit 521, and the redundancy repair circuit 520 stores microbump IDs of defective-contact microbumps by using the eFUSE circuit 521. In the first-modification integrated circuit of Embodiment 2, the system LSI chip does not include the redundancy repair circuit 520 that includes the eFUSE circuit 521.

In the first-modification integrated circuit, the memory access control device includes a BIST (Built-In Self Test) unit that conducts a self connection test of the microbumps and stores positions of defective-contact microbumps. Each time the integrated circuit 100 is activated, the BIST unit conducts a self connection test of the microbumps and stores positions of defective-contact microbumps.

The following describes the structure of the first-modification integrated circuit of Embodiment 2, centering on the differences from the integrated circuit 100 of Embodiment 1, with reference to the drawings.

<Structure>

The first-modification integrated circuit of Embodiment 2 is obtained by modifying the external memory control circuit 519 of the integrated circuit 100 in Embodiment 1 to an external memory control circuit 1819, and the system LSI chip 101 to a system LSI chip 1801. Also, with the modification of the external memory control circuit 519 to the external memory control circuit 1819, the memory access controller 510 is modified to memory access controller 1810.

Figure 18:
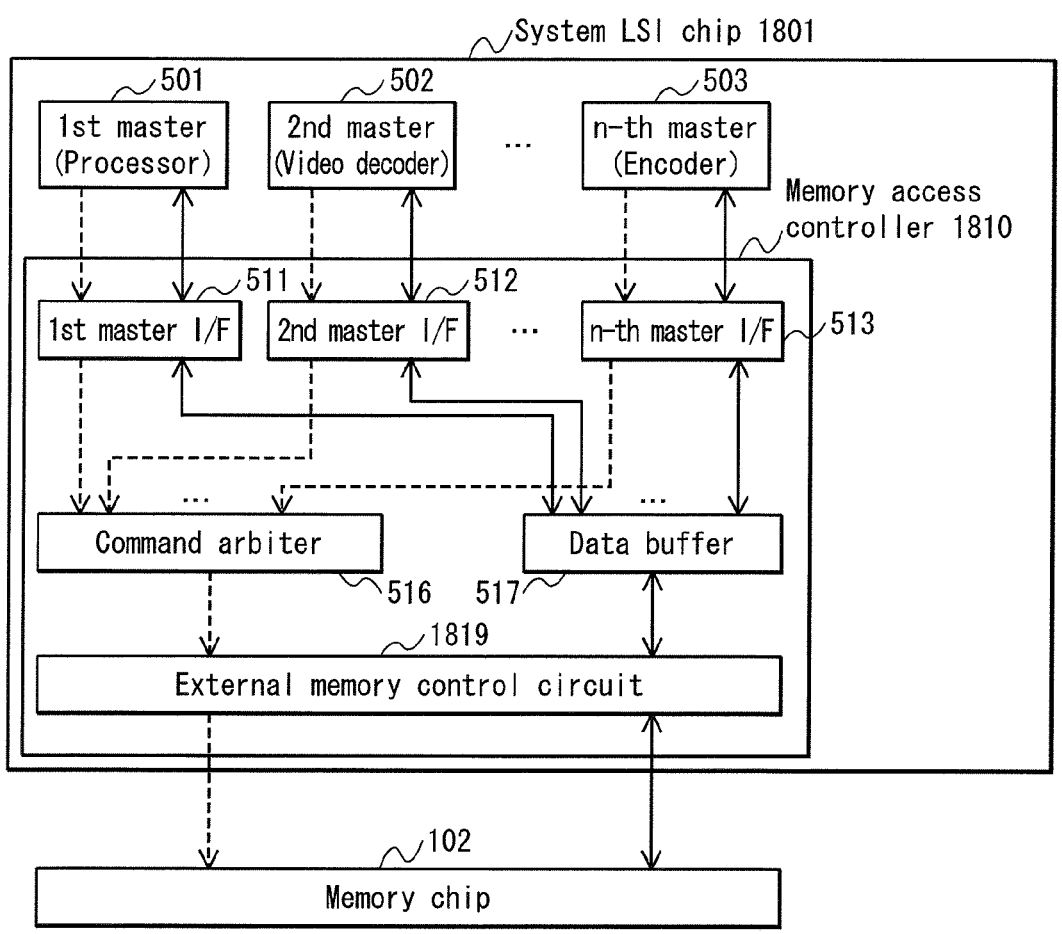
FIG. 18 is a schematic structure diagram illustrating main hardware components of the system LSI chip 1801.

FIG. 18 is a schematic structure diagram illustrating main hardware components of the system LSI chip 1801.

As illustrated in FIG. 18, in the system LSI chip 1801, the redundancy repair circuit 520 has been deleted from the system LSI chip 101 of Embodiment 1, and the memory access controller 510 has been replaced with the memory access controller 1810.

Also, in the memory access controller 1810, the external memory control circuit 519 of the memory access controller 510 in Embodiment 1 has been replaced with the external memory control circuit 1819.

Figure 19:
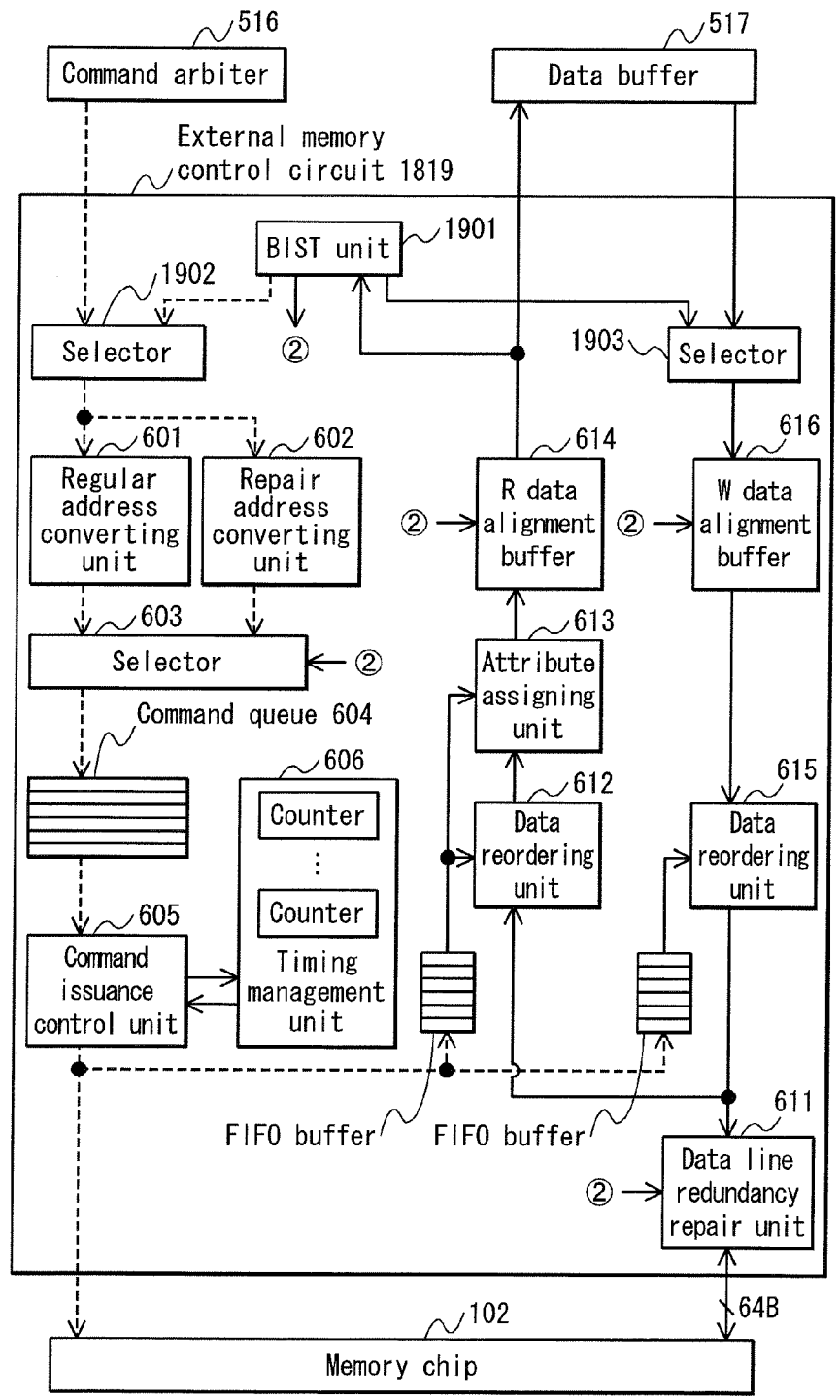
FIG. 19 is a schematic structure diagram illustrating main functions of the external memory control circuit 1819.

FIG. 19 is a schematic structure diagram illustrating main functions of the external memory control circuit 1819.

As illustrated in FIG. 19, in the external memory control circuit 1819, a BIST unit 1901, a selector 1902 and a selector 1903 have been added to the external memory control circuit 519, a connection of the selector 603 from the redundancy repair circuit 520 has been modified to a connection to the BIST unit 1901, a connection of the data line redundancy repair unit 611 from the redundancy repair circuit 520 has been modified to a connection to the BIST unit 1901, a connection of the R data alignment buffer 614 from the redundancy repair circuit 520 has been modified to a connection to the BIST unit 1901, and a connection of the W data alignment buffer 616 from the redundancy repair circuit 520 has been modified to a connection to the BIST unit 1901.

The BIST unit 1901 is connected with the selector 1902, selector 1903, R data alignment buffer 614, selector 603, data line redundancy repair unit 611, and W data alignment buffer 616, includes a storage unit for storing microbump IDs of the defective-contact microbumps, and has the following functions.

Function 1: a function of, upon the activation of the external memory control circuit 1819, generating a test vector and an expected value that are used to check the connection state of the memory data microbump group.

Function 2: a function of identifying defective-contact microbumps by checking the connection state of the memory data microbump group by using the generated test vector and expected value.

Function 3: a function of storing the microbump IDs of the identified defective-contact microbumps into the storage unit that includes the BIST unit 1901.

The selector 1902 is connected with the command arbiter 516, BIST unit 1901, regular address converting unit 601, and repair address converting unit 602, is controlled by the BIST unit 1901, and has a function to select and output a signal sent from the BIST unit 1901 during a period while the BIST unit 1901 tests the connection state of the memory data microbump group, and select and output a signal sent from the command arbiter 516 during a period other than the period while the BIST unit 1901 tests the connection state of the memory data microbump group.

The selector 1903 is connected with the data buffer 517, BIST unit 1901, and W data alignment buffer 616, is controlled by the BIST unit 1901, and has a function to select and output a signal sent from the BIST unit 1901 during the period while the BIST unit 1901 tests the connection state of the memory data microbump group, and select and output a signal sent from the data buffer 517 during a period other than the period while the BIST unit 1901 tests the connection state of the memory data microbump group.

The selector 603, data line redundancy repair unit 611, R data alignment buffer 614, and W data alignment buffer 616 realize the functions, which are, in Embodiment 1, realized based on the microbump IDs of defective-contact microbumps stored in the redundancy removal circuit 520, based on the microbump IDs of defective-contact microbumps stored in the BIST unit 1901.

The following describes the operation of the first-modification integrated circuit having the above-described structure, with reference to the drawings.

<Operation>

The first-modification integrated circuit performs a self-test process in addition to the operation performed by the integrated circuit 100 of Embodiment 1.

The following describes the self-test process.

<Self-Test Process>

The self-test process is a process that is performed by the external memory control circuit 1819 by using the memory chip 102, and in which the external memory control circuit 1819 tests the connection state of the memory data microbump group to identify defective-contact microbumps, and the BIST unit 1901 stores microbump IDs of the identified defective-contact microbumps.

Figure 20:
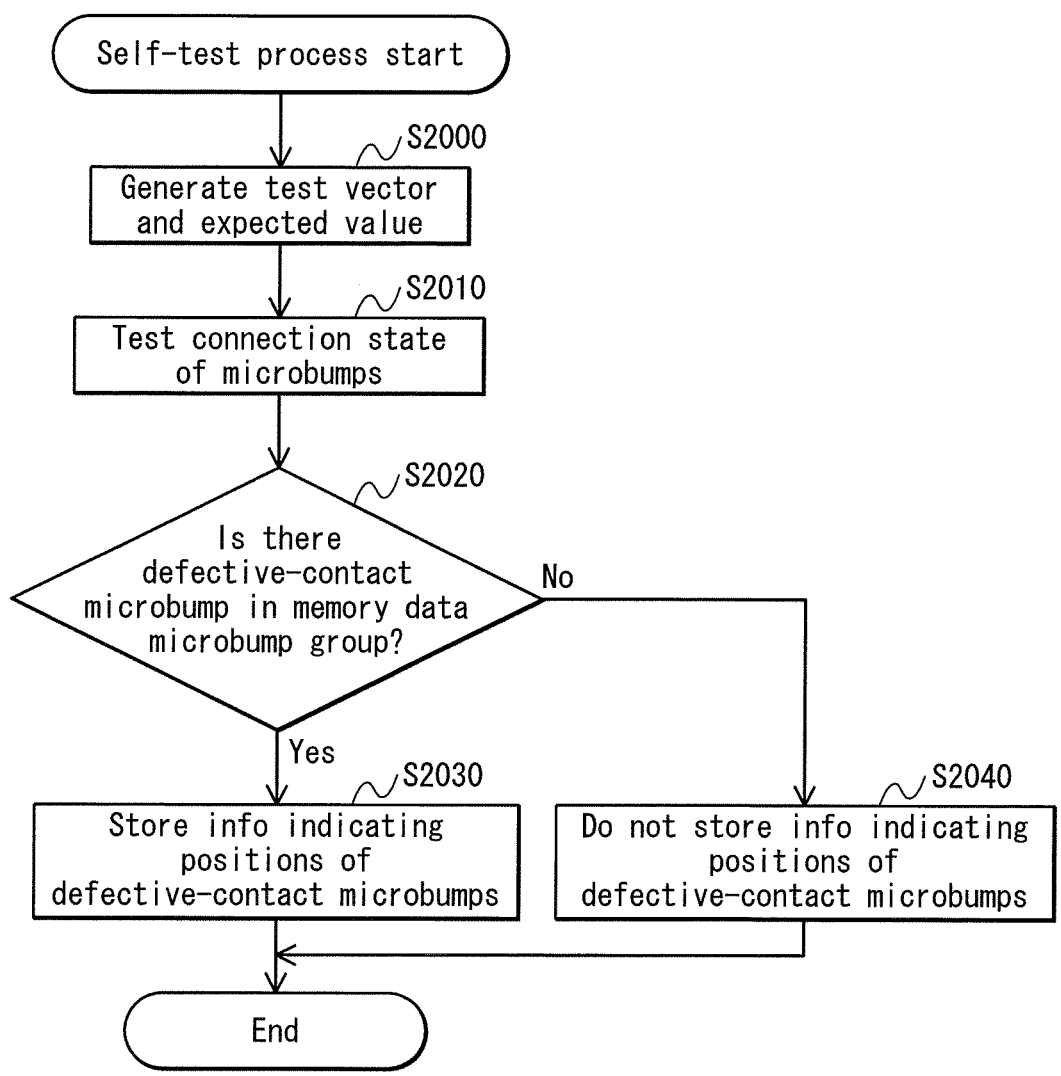
FIG. 20 is a flowchart of the self-test process.

FIG. 20 is a flowchart of the self-test process.

The self-test process is started when the external memory control circuit 1819 is activated.

When the self-test process is started, the BIST unit 1901 generates a test vector and an expected value that are used to check the connection state of the memory data microbump group (step S2000). This test vector includes, for example, a data write command group instructing to write data to the memory chip 102 and a data read command group instructing to read data from the memory chip 102.

After generating a test vector and an expected value, the BIST unit 1901 controls the selectors 1902 and 1903 to test the connection state of the memory data microbump group by using the generated test vector and expected value (step S2010).

When one or more defective-contact microbumps are detected in the memory data microbump group in the process of step S2010 (step S2020: Yes), the BIST unit 1901 stores microbump IDs of the identified defective-contact microbumps into a storage unit that is provided inside thereof (step S2030).

When no defective-contact microbump is detected in the memory data microbump group in the process of step S2010 (step S2020: No), the BIST unit 1901 stores nothing into the storage unit that is provided inside thereof (step S2040).

After completion of the process in step S2030 or S2040, the external memory control circuit 1819 ends the self-test process.

The following considers the first-modification integrated circuit.

<Consideration>

The first-modification integrated circuit, each time the external memory control circuit is activated, tests the connection state of the memory data microbump group, and when one or more defective-contact microbumps are present, stores the microbump IDs of the defective-contact microbumps.

With this structure, the first-modification integrated circuit, although it does not include the eFUSE circuit, operates as a good-quality product for popular use even if one or more defective-contact microbumps are included in the memory data microbump group. Furthermore, even if a new defective-contact microbump occurs after the shipment of the product, it is possible to use storage areas by reflecting the presence of the new defective-contact microbump.

This structure is also effective in the product that has been shipped as a product for high functionality. Conventionally, when a connection failure occurs, the product cannot be used and loses value as a commercial product. However, the product of the present invention can be used if a failure occurs, although the operation is restricted to the level of a product for popular use. This makes it possible to use the basic function even when the failure cannot be repaired soon.

Embodiment 3

Outline

The following describes, as one example of a memory access control device of the present invention, a second-modification integrated circuit which is obtained by modifying a part of the integrated circuit 100 of Embodiment 1.

In the integrated circuit 100 of Embodiment 1, the external memory control circuit 519 includes the regular address converting unit 601 and repair address converting unit 602. In the second-modification integrated circuit of Embodiment 3, the external memory control circuit 519 does not include the regular address converting unit 601.

The second-modification integrated circuit always issues a memory instruction, which is generated by the repair address converting unit 602 based on a physical address converted by itself, regardless of whether or not a defective-contact microbump is present. Thus, regardless of whether or not a defective-contact microbump is present, the masters included in the system LSI chip 101 use the 192-MB storage area composed of the banks A 310, B 320 and C 330. In this case, the 64-MB storage area composed of the bank D 340 is used to repair a storage area that cannot be accessed due to the presence of the defective-contact microbumps, among the 192-MB storage area composed of the banks A 310, B 320 and C 330.

The following describes the structure of the second-modification integrated circuit of Embodiment 3, centering on the differences from the integrated circuit 100 of Embodiment 1, with reference to the drawings.

<Structure>

The second-modification integrated circuit of Embodiment 3 is obtained by modifying the external memory control circuit 519 of the integrated circuit 100 in Embodiment 1 to an external memory control circuit 2119.

Figure 21:
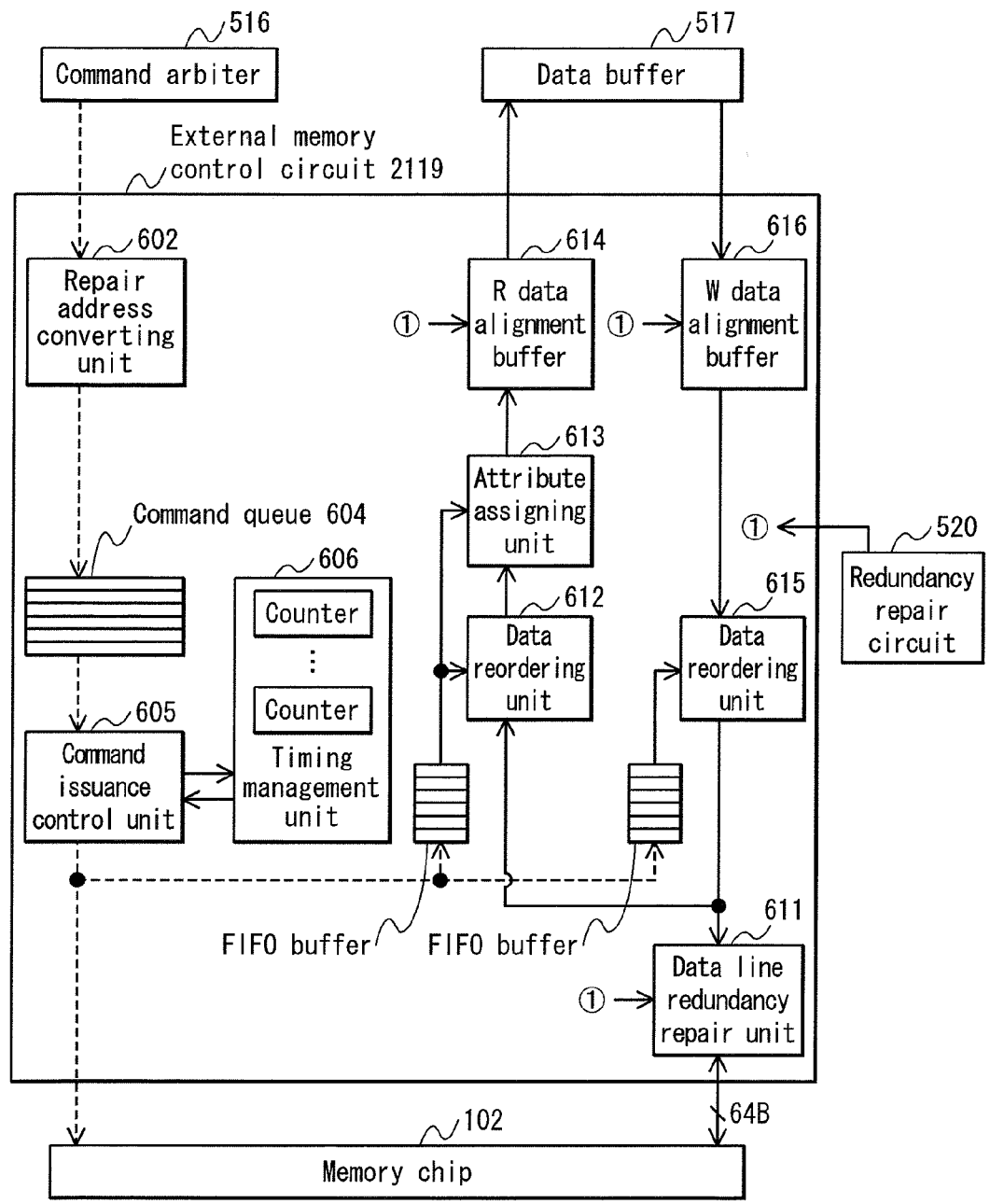
FIG. 21 is a schematic structure diagram illustrating main hardware components of the external memory control circuit 2119.

FIG. 21 is a schematic structure diagram illustrating main hardware components of the external memory control circuit 2119.

As illustrated in FIG. 21, in the external memory control circuit 2119, the regular address converting unit 601 and selector 603 have been deleted from the external memory control circuit 519 of Embodiment 1, and the repair address converting unit 602 has been modified to be connected with the command arbiter 516 and command queue 604. With this structure, the second-modification integrated circuit always issues a memory instruction, which is generated by the repair address converting unit 602 based on a physical address converted by itself, regardless of whether or not a defective-contact microbump is present.

The following describes a manufacturing method of the above-described second-modification integrated circuit, with reference to the drawings.

<Manufacturing Method>

Figure 22:
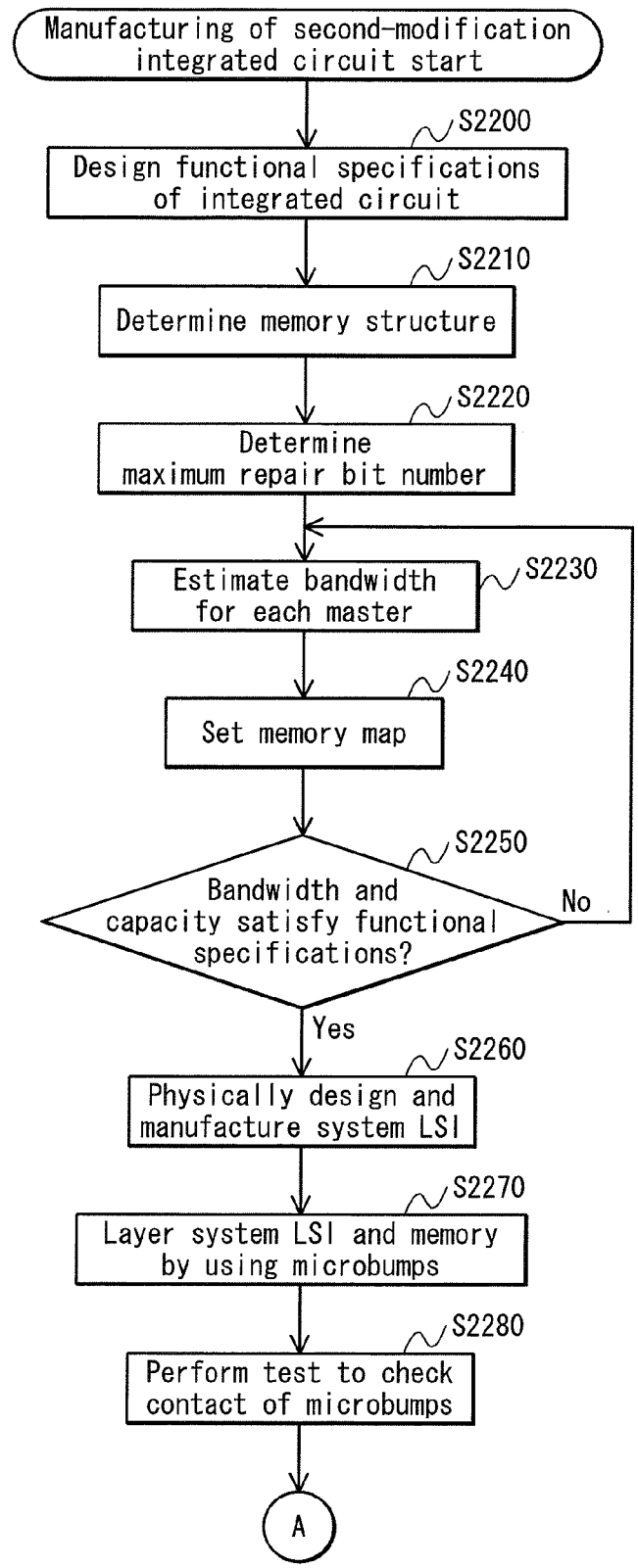
FIG. 22 is a flowchart 1 of the manufacturing method of the second-modification integrated circuit.
Figure 23:
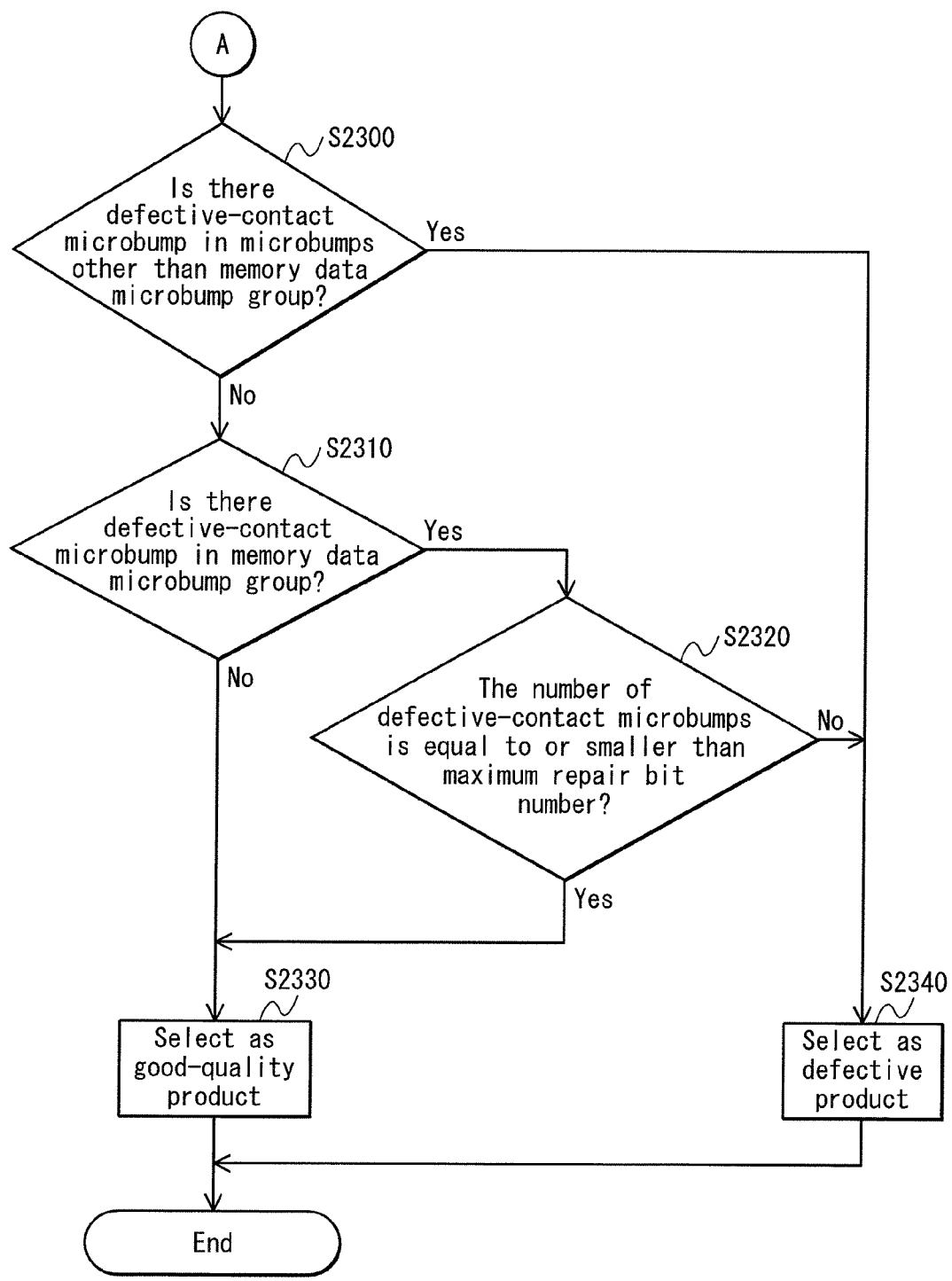
FIG. 23 is a flowchart 2 of the manufacturing method of the second-modification integrated circuit.

FIGS. 22 and 23 are flowcharts of the manufacturing method of the second-modification integrated circuit.

The manufacturing of the second-modification integrated circuit, as with the manufacturing of the integrated circuit 100 in Embodiment 1, starts with designing the second-modification integrated circuit.

The processes of steps S2200 through S2220 are the same as the processes of steps S1600 through S1620 in Embodiment 1. Thus the explanation of these processes is omitted.

Following the process of step S2220, a memory bandwidth for communication from the masters to the memory chip 102 is estimated (step S2230), and a memory map of the memory chip 102 is determined (step S2240).

The processes of steps S2250 through S2320 are the same as the processes of steps S1650 through S1720 in Embodiment 1. Thus the explanation of these processes is omitted.

When it is judged that microbumps of the memory data microbump group do not include a defective-contact microbump (step S2310: No), or when it is judged that the number of defective-contact microbumps is equal to or smaller than the maximum repair bit number (step S2320: Yes), the second-modification integrated circuit is selected as a good-quality product (step S2330).

When it is judged that microbumps other than microbumps of the memory data microbump group include a defective-contact microbump (step S2300: Yes), or when it is judged that the number of defective-contact microbumps is greater than the maximum repair bit number (step S2320: No), the second-modification integrated circuit is selected as a defective product (step S2340).

After completion of the process in step S2320 or S2340, the manufacturing of the second-modification integrated circuit ends.

<Consideration>

In the second-modification integrated circuit, no failure occurs when the microbumps of the memory data microbump group include 128 or less defective-contact microbumps. Furthermore, in that case, the second-modification integrated circuit is selected as a good-quality product.

Embodiment 4

Outline

The following describes, as one example of a memory access control device of the present invention, a third-modification integrated circuit which is obtained by modifying a part of the integrated circuit 100 of Embodiment 1.

In the third-modification integrated circuit, the repair address converting unit 602 of Embodiment 1 has been modified to a first-modification repair address converting unit.

In Embodiment 1, the repair address converting unit 602 converts a logical address to a physical address so that the 64-MB storage area composed of the bank D 340 is used to repair a storage area that cannot be accessed due to the presence of defective-contact microbumps, among the 192-MB storage area composed of the banks A 310, B 320 and C 330. In Embodiment 4, the first-modification repair address converting unit converts a logical address to a physical address so that a 128-MB storage area composed of the banks C 330 and D 340 is used to repair a storage area that cannot be accessed due to the presence of defective-contact microbumps, among a 128-MB storage area composed of the banks A 310 and B 320.

<Structure>

The first-modification repair address converting unit is connected with the command arbiter 516 and selector 603, and has the following two functions.

Function 1: a repair address converting function of converting a logical address, which indicates a starting address of an m-bit storage area included in a master-issued memory command received from the command arbiter 516, to (i) a physical address which indicates a starting address of an m-bit storage area (hereinafter referred to as "first m-bit storage area") in the 128-MB storage area composed of the banks A 310 and B 320 in the memory chip 102, and (ii) a physical address which indicates a starting address of an m-bit storage area (hereinafter referred to as "second m-bit storage area") in the 128-MB storage area composed of the banks C 330 and D 340 in the memory chip 102.

It should be noted here that the relationship between the first m-bit storage area and the second m-bit storage area is as follows. That is to say: (1) a pair of a row address and a column address which specify a storage area of the bank A 310 among the first m-bit storage area is equal to a pair of a row address and a column address which specify a storage area of the bank C 330 among the second m-bit storage area; and (2) a pair of a row address and a column address which specify a storage area of the bank B 320 among the first m-bit storage area is equal to a pair of a row address and a column address which specify a storage area of the bank D 340 among the second m-bit storage area.

Function 2: an instruction converting function of converting, by using the physical address obtained by performing the repair address converting function, a memory access instruction, which is included in a master-issued memory command received from the command arbiter 516, to a memory instruction that can be used by the memory chip 102.

Figure 24:
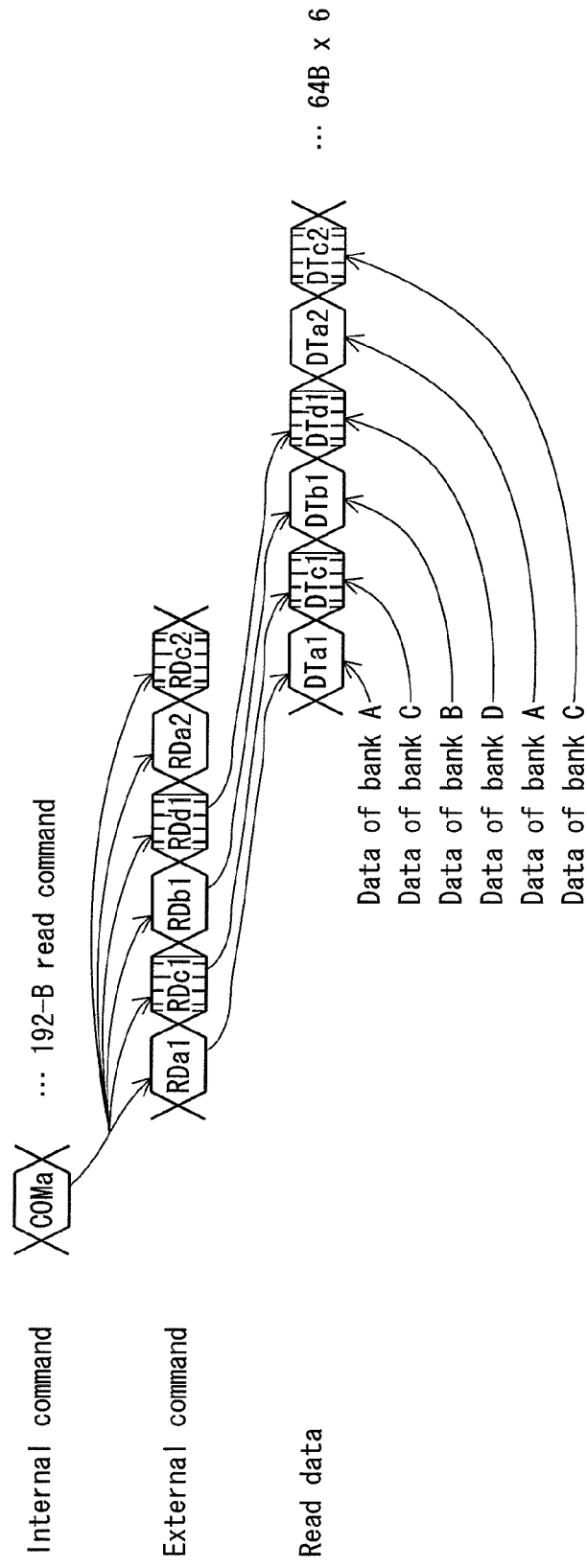
FIG. 24 is a timing chart of a data reading.

FIG. 24 is a timing chart illustrating an example case where a master-issued memory command is input to the first-modification repair address converting unit, the master-issued memory command is converted to a memory instruction and the memory instruction is output by the first-modification repair address converting unit, and as a result, data is read from the memory chip 102. In this example case, the master-issued memory command instructs to read continuous 192-B data from a storage area in the memory chip 102 whose starting address is physical address "0x30000000".

The first-modification repair address converting unit, upon receiving the master-issued memory command instructing to read continuous 192-B data, generates, by using the repair address converting function and instruction converting function, and outputs: (1) memory instructions RDa1 and RDc1 that instruct to read data from 64-B storage areas of the banks A 310 and C 330 that are respectively specified by the same row address "0x000" and the same column address "0x00"; (2) memory instructions RDb1 and RDd1 that instruct to read data from 64-B storage areas of the banks B 320 and D 340 that are respectively specified by the same row address "0x000" and the same column address "0x00"; and (3) memory instructions RDa2 and RDc2 that instruct to read data from 64-B storage areas of the banks A 310 and C 330 that are respectively specified by the same row address "0x000" and the same column address "0x01".

Upon receiving these memory instructions, the memory chip 102 reads 64-B data DTa1, 64-B data DTc1, 64-B data DTb1, 64-B data DTd1, 64-B data DTa2, and 64-B data DTc2 from the banks A 310, C 330, B 320, D 340, A 310, and C 330, respectively, and outputs the read data DTa1, DTc1, DTb1, DTd1, DTa2, and DTc2.

Figure 25:
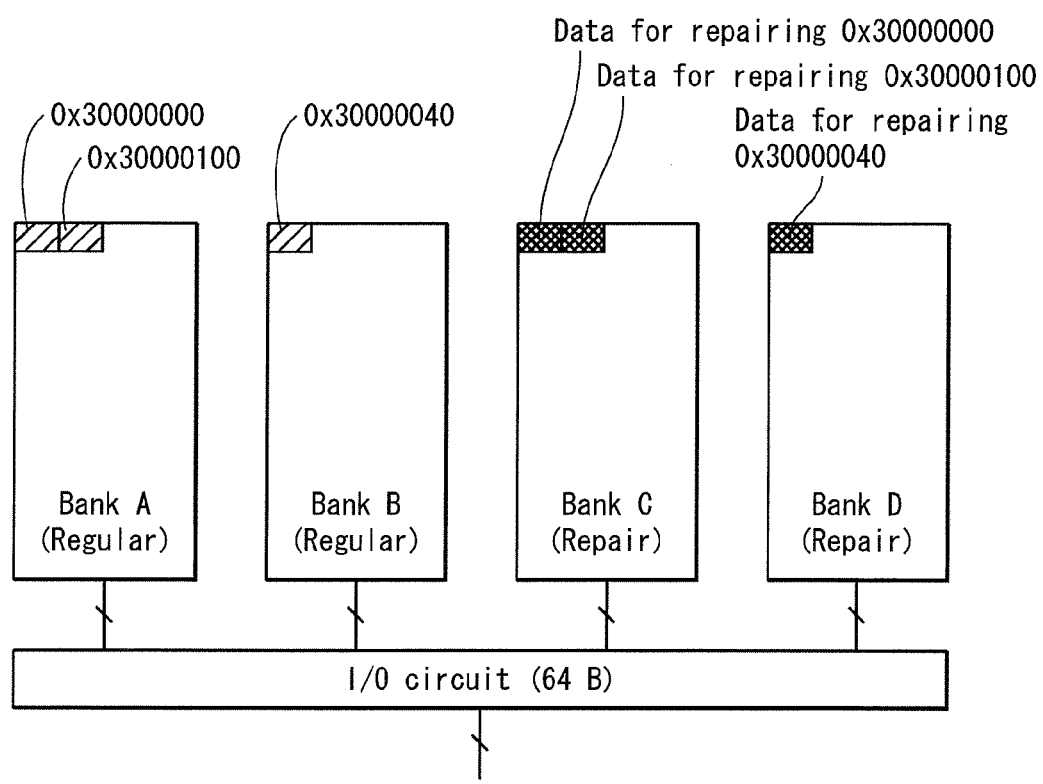
FIG. 25 is a schematic diagram illustrating the areas respectively storing data DTa1, DTc1, DTb1, DTd1, DTa2, and DTc2.

FIG. 25 is a schematic diagram illustrating the areas respectively storing data DTa1, DTc1, DTb1, DTd1, DTa2, and DTc2 in the above example.

As illustrated in FIG. 25, in the above example case, the starting physical address of the area storing data DTa1 is row address "0x000" and column address "0x00" of the bank A 310, the starting physical address of the area storing data DTb1 is row address "0x000" and column address "0x00" of the bank B 320, the starting physical address of the area storing data DTc1 is row address "0x000" and column address "0x00" of the bank C 330, the starting physical address of the area storing data DTd1 is row address "0x000" and column address "0x00" of the bank D 340, the starting physical address of the area storing data DTa2 is row address "0x000" and column address "0x01" of the bank A 310, and the starting physical address of the area storing data DTc2 is row address "0x000" and column address "0x01" of the bank C 330.

Figure 26:
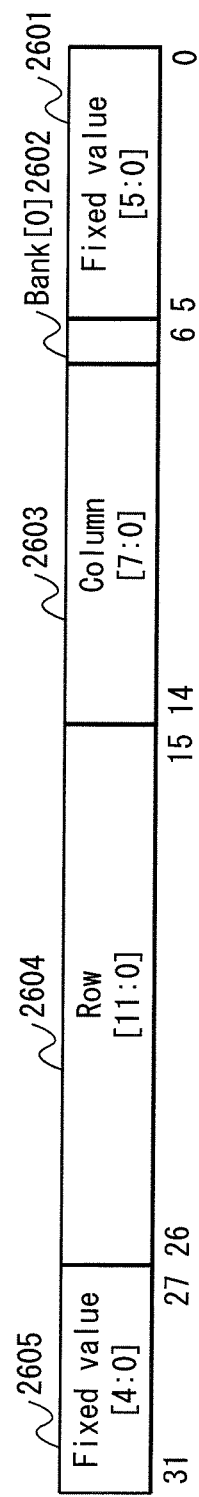
FIG. 26 is a structure diagram illustrating the structure of the logical address of the memory chip 102.

For converting a logical address to a physical address, the present embodiment uses the conversion rule illustrated in FIG. 26 in which the conversion rule illustrated in FIG. 4 has been shifted rightward as a whole by one bit. This makes it possible to share more hardware resources for the regular address conversion and repair address conversion.

It should be noted however that, with regard to the bank address included in this conversion rule, it indicates a conversion of the lowest one bit, and thus in the actual access to the external memory, "0" needs to be added to the upper bit of the regular bank, and "1" needs to be added to the upper bit of the repair bank.

<Consideration>

In the third-modification integrated circuit, when the memory data microbump group has 128 or more defective-contact microbumps, the memory chip 102 can be used if the number of the defective-contact microbumps is 256 or smaller.

Embodiment 5

Outline

The following describes, as one example of a memory access control device of the present invention, a fourth-modification integrated circuit which is obtained by modifying a part of the integrated circuit 100 of Embodiment 1.

In the fourth-modification integrated circuit, the repair address converting unit 602 of Embodiment 1 has been modified to a second-modification repair address converting unit.

In Embodiment 1, the repair address converting unit 602 converts a logical address to a physical address so that the 64-MB storage area composed of the bank D 340 is used to repair a storage area that cannot be accessed due to the presence of defective-contact microbumps, among the 192-MB storage area composed of the banks A 310, B 320 and C 330. In Embodiment 5, the second-modification repair address converting unit converts a logical address to a physical address so that a 128-MB storage area among the 256-MB storage area composed of the banks A 310, B 320, C 330 and D 340 is used to repair a storage area, among the remaining 128-MB storage area, that cannot be accessed due to the presence of defective-contact microbumps.

<Structure>

The second-modification repair address converting unit is connected with the command arbiter 516 and selector 603, and has the following two functions.

Function 1: a repair address converting function of converting a logical address, which indicates a starting address of an m-bit storage area included in a master-issued memory command received from the command arbiter 516, to (i) a physical address indicating a starting address of an m-bit storage area in which the lowest bit of the column address is "0" (hereinafter the m-bit storage area is referred to as "first m-bit storage area") in the 128-MB storage area, among 256-MB storage area composed of the banks A 310, B 320, C 330 and D 340 in the memory chip 102, and (ii) a physical address indicating a starting address of an m-bit storage area in which the lowest bit of the column address is "1" (hereinafter the m-bit storage area is referred to as "second m-bit storage area") in the 128-MB storage area, among 256-MB storage area composed of the banks A 310, B 320, C 330 and D 340 in the memory chip 102.

Function 2: an instruction converting function of converting, by using the physical address obtained by performing the repair address converting function, a memory access instruction, which is included in a master-issued memory command received from the command arbiter 516, to a memory instruction that can be used by the memory chip 102.

Figure 27:
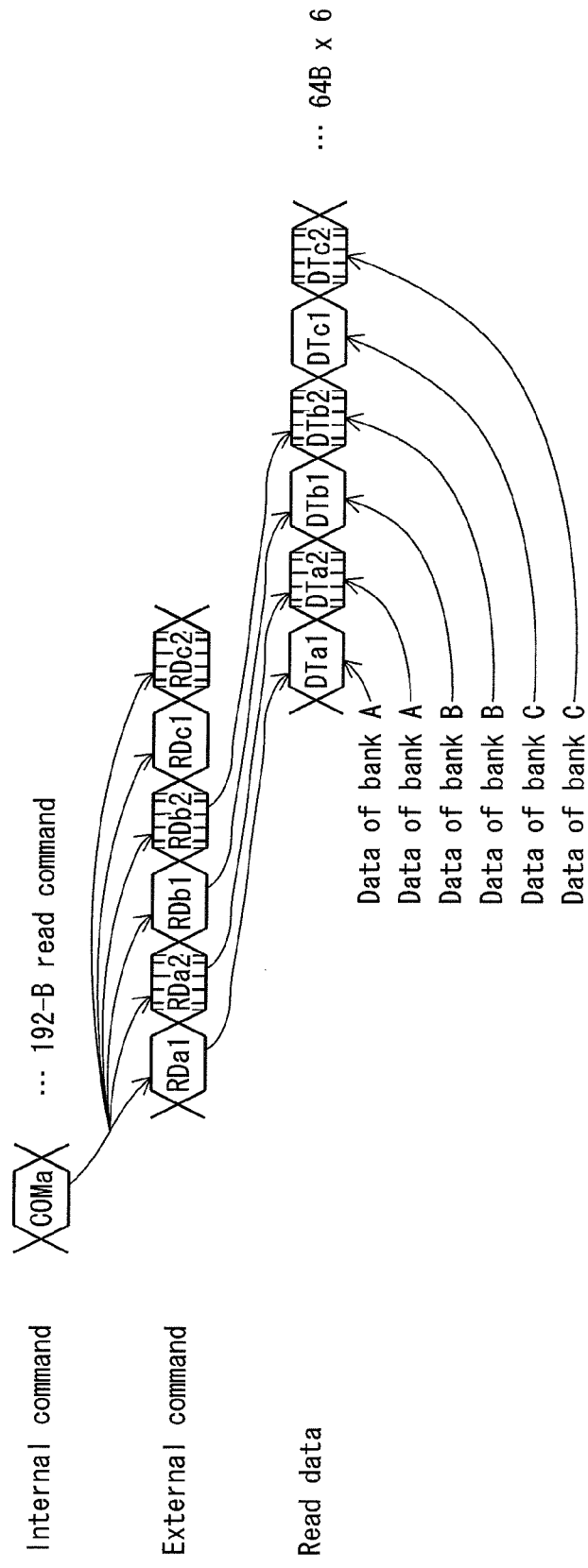
FIG. 27 is a timing chart of a data reading.

FIG. 27 is a timing chart illustrating an example case where a master-issued memory command is input to the second-modification repair address converting unit, the master-issued memory command is converted to a memory instruction and the memory instruction is output by the second-modification repair address converting unit, and as a result, data is read from the memory chip 202. In this example case, the master-issued memory command instructs to read continuous 192-B data from a storage area in the memory chip 102 whose starting address is physical address "0x30000000".

The second-modification repair address converting unit, upon receiving the master-issued memory command instructing to read continuous 192-B data, generates, by using the repair address converting function and instruction converting function, and outputs: (1) memory instructions RDa1 and RDa2 that instruct to read data from 64-B storage areas of the bank A 310 that are respectively specified by the same row address "0x000" and continuous column addresses "0x00" and "0x01"; (2) memory instructions RDb1 and RDb2 that instruct to read data from 64-B storage areas of the bank B 320 that are respectively specified by the same row address "0x000" and continuous column addresses "0x00" and "0x01"; and (3) memory instructions RDc1 and RDc2 that instruct to read data from 64-B storage areas of the bank C 330 that are respectively specified by the same row address "0x000" and continuous column addresses "0x00" and "0x01".

Upon receiving these memory instructions, the memory chip 102 reads 64-B data DTa1 and 64-B data DTa2 from the bank A 310, 64-B data DTb1 and 64-B data DTb2 from the bank B 320, and 64-B data DTc1 and 64-B data DTc2 from the bank C 330, and outputs the read data.

Figure 28:
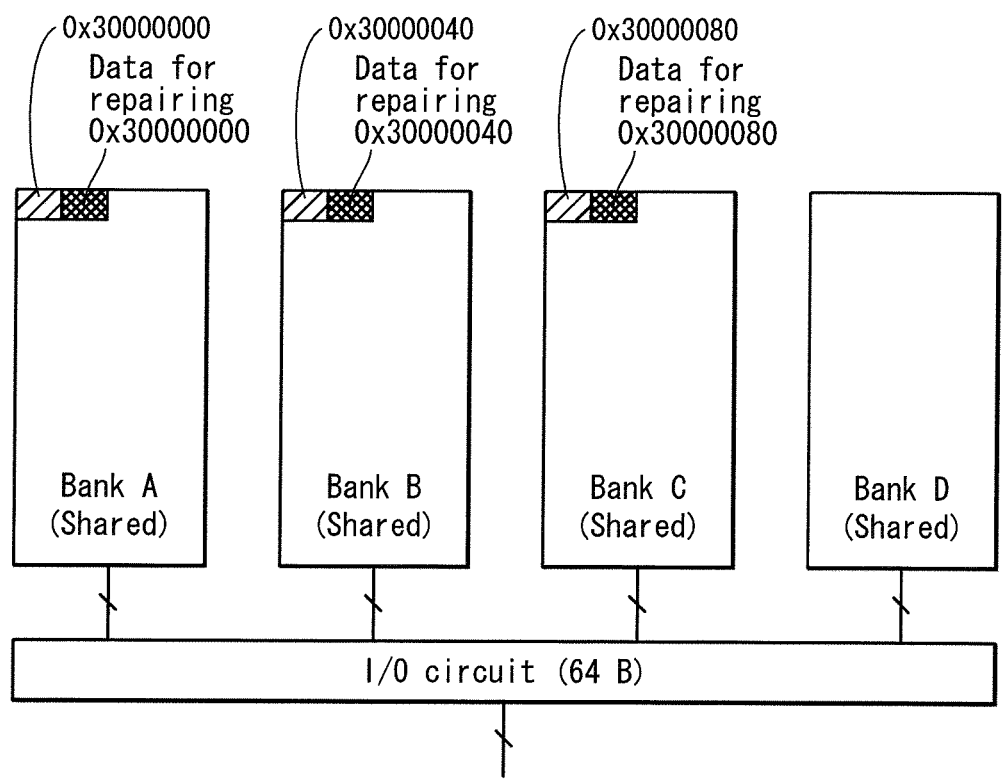
FIG. 28 is a schematic diagram illustrating the areas respectively storing data DTa1, DTa2, DTb1, DTb2, DTc1, and DTc2.

FIG. 28 is a schematic diagram illustrating the areas respectively storing data DTa1, DTa2, DTb1, DTb2, DTc1, and DTc2 in the above example.

As illustrated in FIG. 28, in the above example case, the starting physical address of the area storing data DTa1 is row address "0x000" and column address "0x00" of the bank A 310, the starting physical address of the area storing data DTb1 is row address "0x000" and column address "0x00" of the bank B 320, the starting physical address of the area storing data DTc1 is row address "0x000" and column address "0x00" of the bank C 330, the starting physical address of the area storing data DTa2 is row address "0x000" and column address "0x01" of the bank A 310, the starting physical address of the area storing data DTb2 is row address "0x000" and column address "0x01" of the bank B 320, and the starting physical address of the area storing data DTc2 is row address "0x000" and column address "0x01" of the bank C 330.

For converting a logical address to a physical address, the present embodiment uses the conversion rule illustrated in FIG. 29 in which the column address area 3203 corresponds to the column address field 403 of the conversion rule illustrated in FIG. 4, and the lowest bit of the column address field 403 has been set to a fixed value "1b0". This makes it possible to share more hardware resources for the regular address conversion and repair address conversion.

It should be noted here that, when accessing the column for repair, the lowest bit needs to be fixed to "1b1".

<Consideration>

In the fourth-modification integrated circuit, when the memory data microbump group has 128 or more defective-contact microbumps, the memory chip 102 can be used if the number of the defective-contact microbumps is 256 or smaller.

Embodiment 6

Outline

The following describes, as one example of a memory access control device of the present invention, a fifth-modification integrated circuit which is obtained by modifying a part of the fourth-modification integrated circuit of Embodiment 5.

In the fifth-modification integrated circuit, the second-modification repair address converting unit of Embodiment 5 has been modified to a third-modification repair address converting unit.

In Embodiment 5, the second-modification repair address converting unit converts a logical address to a physical address so that a 128-MB storage area, in which the lowest bit of the column address is "1", among the 256-MB storage area composed of the banks A 310, B 320, C 330 and D 340 is used to repair a storage area in which the lowest bit of the column address is "0", among the remaining 128-MB storage area, that cannot be accessed due to the presence of defective-contact microbumps. In Embodiment 6, the third-modification repair address converting unit converts a logical address to a physical address so that an upper-side, 32-B storage area of the 64-B storage area specified by a pair of row address and column address is used to repair a storage area, among a lower-side, 32-B storage area, that cannot be accessed due to the presence of defective-contact microbumps.

<Structure>

The third-modification repair address converting unit is connected with the command arbiter 516 and selector 603, and has the following two functions.

Function 1: a repair address converting function of converting a logical address, which indicates a starting address of an m-bit storage area included in a master-issued memory command received from the command arbiter 516, to a physical address indicating a starting address of an m-bit storage area in which among the 256-MB storage area composed of the banks A 310, B 320, C 330 and D 340 in the memory chip 102.

Function 2: an instruction converting function of converting, by using the physical address obtained by performing the repair address converting function, a memory access instruction, which is included in a master-issued memory command received from the command arbiter 516, to a memory instruction that can be used by the memory chip 102.

Figure 30:
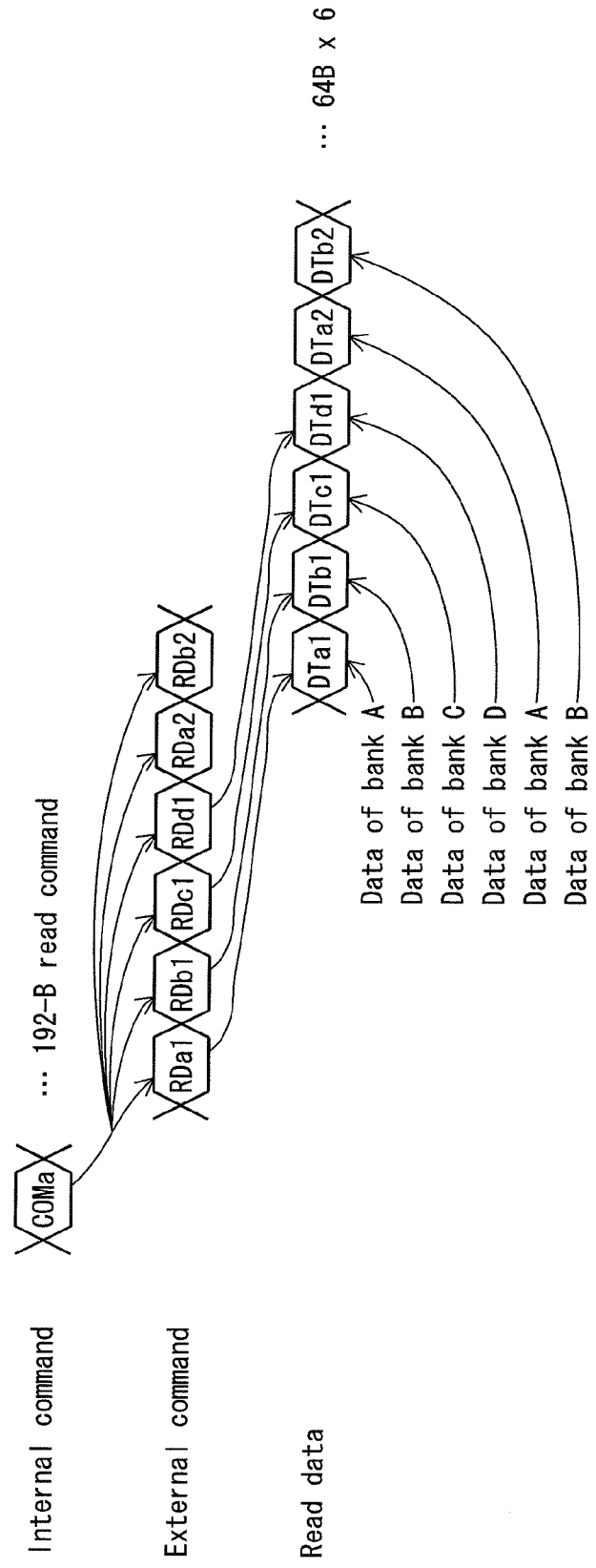
FIG. 30 is a timing chart of a data reading.

FIG. 30 is a timing chart illustrating an example case where a master-issued memory command is input to the third-modification repair address converting unit, the master-issued memory command is converted to a memory instruction and the memory instruction is output by the third-modification repair address converting unit, and as a result, data is read from the memory chip 102. In this example case, the master-issued memory command instructs to read continuous 192-B data from a storage area in the memory chip 102 whose starting address is physical address "0x30000000".

The third-modification repair address converting unit, upon receiving the master-issued memory command instructing to read continuous 192-B data, generates six memory instructions RDa1, RDb1, RDc1, RDd1, RDa2, and RDb2 by using the repair address converting function and instruction converting function and outputs the generated memory instructions, wherein the memory instructions RDa1, RDb1, RDc1, RDd1, RDa2, and RDb2 instruct to read data from continuous 64-B storage areas.

Upon receiving these memory instructions, the memory chip 102 reads 64-B data DTa1, 64-B data DTb1, 64-B data DTc1, 64-B data DTd1, 64-B data DTa2, and 64-B data DTb2 from the banks A 310, B 320, C 330, D 340, A 310, and B 320, respectively, and outputs the read data DTa1, DTb1, DTc1, DTd1, DTa2, and DTb2.

Figure 31:
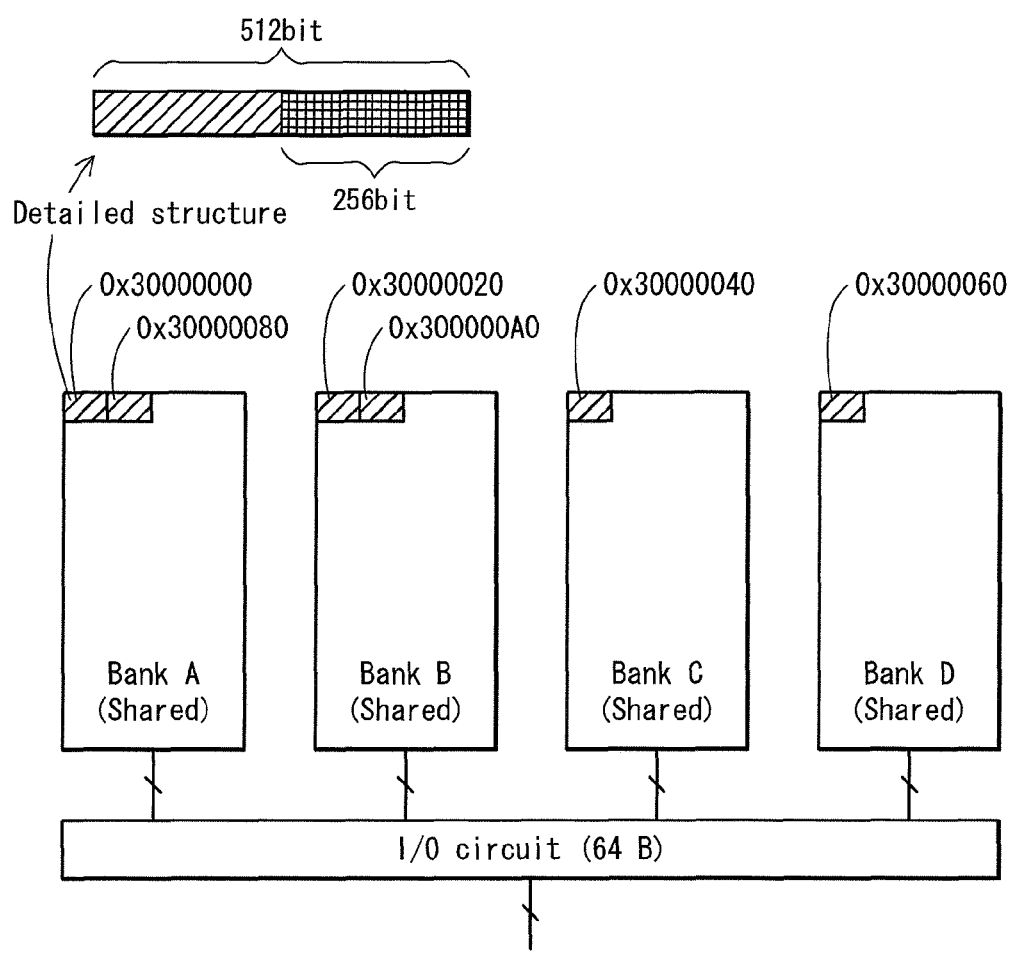
FIG. 31 is a schematic diagram illustrating the areas respectively storing data DTa1, DTb1, DTc1, DTd1, DTa2, and DTb2.

FIG. 31 is a schematic diagram illustrating the areas respectively storing data DTa1, DTb1, DTc1, DTd1, DTa2, and DTb2 in the above example.

As illustrated in FIG. 31, in the above example case, the starting physical address of the area storing data DTa1 is row address "0x000" and column address "0x00" of the bank A 310, the starting physical address of the area storing data DTb1 is row address "0x000" and column address "0x00" of the bank B 320, the starting physical address of the area storing data DTc1 is row address "0x000" and column address "0x00" of the bank C 330, the starting physical address of the area storing data DTd1 is row address "0x000" and column address "0x00" of the bank D 340, the starting physical address of the area storing data DTa2 is row address "0x000" and column address "0x01" of the bank A 310, and the starting physical address of the area storing data DTb2 is row address "0x000" and column address "0x01" of the bank B 320.

For converting a logical address to a physical address, the present embodiment uses the conversion rule illustrated in FIG. 32 in which the conversion rule illustrated in FIG. 4 has been shifted rightward as a whole by one bit so that the number of bits of the fixed value area 2901 corresponding to the fixed value field 401 is smaller than that of the fixed value field 401 by one bit. This makes it possible to share more hardware resources for the regular address conversion and repair address conversion.

<Consideration>

In the fifth-modification integrated circuit, when the memory data microbump group has 128 or more defective-contact microbumps, the memory chip 102 can be used if the number of the defective-contact microbumps is 256 or smaller.

Embodiment 7

Outline

The following describes a manufacturing method of a tablet terminal and a smartphone terminal that are each embedded with the integrated circuit 100 of Embodiment 1 as one example of a memory access control device of the present invention.

<Structure>

The tablet terminal is a portable thin personal computer provided with a touch panel which contains a so-called "4K2K" liquid-crystal display with 3840×2160 pixels.

This tablet terminal has a function to display images on the 4K2K liquid-crystal display at a predetermined frame rate. The operational condition for realizing this function is that, in the integrated circuit 100 embedded in the tablet terminal, the system LSI chip 101 can use the memory chip 102 in 8 GB/s bandwidth. Accordingly, when the tablet terminal is embedded with an integrated circuit 100 selected as a good-quality product for high functionality (for which 10 GB/s of bandwidth is secured), the tablet terminal operates normally; but when the tablet terminal is embedded with an integrated circuit 100 selected as a good-quality product for popular use (for which 7 GB/s of bandwidth is secured), the tablet terminal does not operate normally.

The smartphone terminal is a mobile phone provided with a touch panel which contains a so-called "VGA (Video Graphics Array" liquid-crystal display with 640×480 pixels.

This smartphone terminal has a function to display images on the VGA liquid-crystal display at a predetermined frame rate. The operational condition for realizing this function is that, in the integrated circuit 100 embedded in the smartphone terminal, the system LSI chip 101 can use the memory chip 102 in 0.5 GB/s bandwidth. Accordingly, the smartphone terminal operates normally in both cases where it is embedded with an integrated circuit 100 selected as a good-quality product for high functionality and where it is embedded with an integrated circuit 100 selected as a good-quality product for popular use.

The following describes a manufacturing method of the above tablet terminal and smartphone terminal, manufactured by the manufacturer of the integrated circuit 100 by using the integrated circuit 100 it manufactures, with reference to the attached drawings.

<Manufacturing Method>

Figure 33:
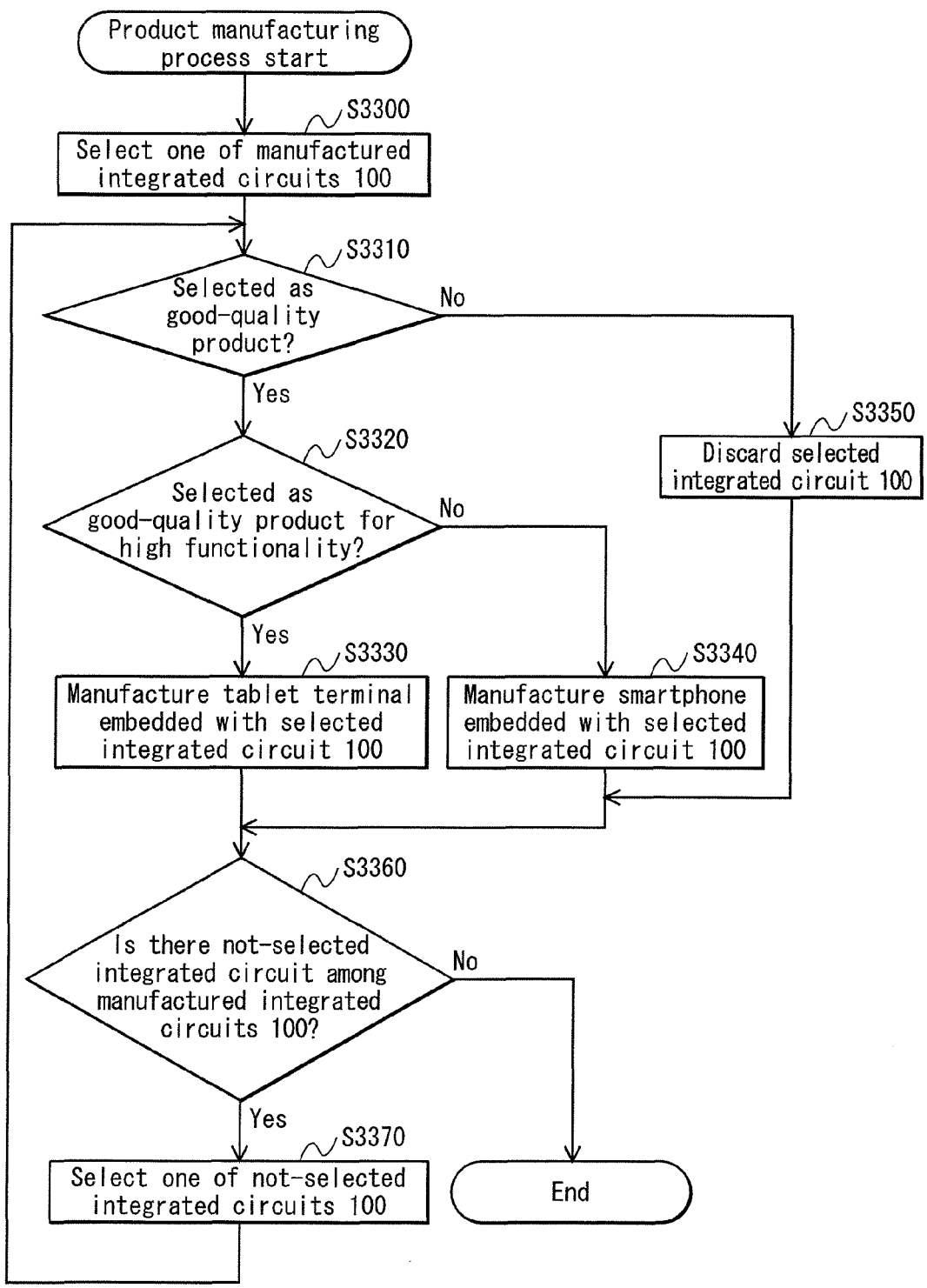
FIG. 33 is a flowchart of the product manufacturing process.

FIG. 33 is a flowchart of a product manufacturing process for manufacturing the tablet terminal and smartphone terminal.

The product manufacturing process is started when the number of manufactured integrated circuits 100 reaches a predetermined number (for example, 1000). Note that the manufacturing method of the integrated circuit 100 is described in detail in <Manufacturing method> of Embodiment 1.

When the product manufacturing process is started, the selector of the integrated circuit 100 selects one of the manufactured integrated circuits 100 (step S3300), and it is judged whether the selected integrated circuit 100 has not been selected as a defective product in the manufacturing process by the manufacturing method of Embodiment 1 (see, for example, the processes of steps S1700 through S1770 illustrated in FIG. 17), namely, whether or not the selected integrated circuit 100 has been selected as a good-quality product (step S3310).

When it is judged that the selected integrated circuit 100 has been selected as a good-quality product (step S3310: Yes), the selecter further judges whether or not the selected integrated circuit 100 has been selected as a good-quality product for high functionality in the manufacturing process by the manufacturing method of Embodiment 1 (see, for example, the processes of steps S1700, S1760, and S1770 illustrated in FIG. 17) (step S3320).

When it is judged that the selected integrated circuit 100 has been selected as a good-quality product for high functionality (step S3320: Yes), the selecter passes the integrated circuit 100 to a manufacturing line operator who operates a tablet terminal manufacturing line for manufacturing the tablet terminal. The manufacturing line operator manufactures a tablet terminal that is embedded with the received integrated circuit 100 by operating the tablet terminal manufacturing line (step S3330).

When it is judged that the selected integrated circuit 100 has not been selected as a good-quality product for high functionality (step S3320: No), namely, when the selected integrated circuit 100 has been selected as a good-quality product for popular use, the selecter passes the integrated circuit 100 to a manufacturing line operator who operates a smartphone terminal manufacturing line for manufacturing the smartphone terminal. The manufacturing line operator manufactures a smartphone terminal that is embedded with the received integrated circuit 100 by operating the smartphone terminal manufacturing line (step S3340).

When it is judged that the selected integrated circuit 100 has not been selected as a good-quality product (step S3310: No), namely, when the selected integrated circuit 100 has been selected as a defective product, the selecter discards the integrated circuit 100 (step S3350). Thus the integrated circuit 100 selected as a defective product is embedded in neither a tablet terminal nor a smartphone terminal.

After completion of the process in step S3330, S3340, or S3350, the selecter judges whether or not there is a not-selected integrated circuit among the manufactured integrated circuits 100 (step S3360).

When it is judged that there is a not-selected integrated circuit among the manufactured integrated circuits 100 (step S3360: Yes), the selecter selects one of not-selected integrated circuits 100 (step S3370), and returns to step S3310 to perform the process thereof and onwards.

When it is judged that there is no not-selected integrated circuit among the manufactured integrated circuits 100 (step S3360: No), the product manufacturing process ends.

<Consideration>

Even if it is detected during the manufacturing process of an integrated circuit 100 that there are one or more defective-contact microbumps in the memory data microbump group, if the number of defective-contact microbumps is equal to or smaller than the maximum repair bit number, the manufacturer of the tablet terminal and smartphone terminal can manufacture and sell a smartphone terminal that is embedded with the integrated circuit 100 including the defective-contact microbumps. This makes it possible for the manufacturer to manufacture and sell more products than the case where all integrated circuits 100 that include one or more defective-contact microbumps in the memory data microbump group are discarded.

<Supplementary Notes>

Up to now, six examples of integrated circuits have been explained through Embodiments 1 to 6 as embodiments of the memory access control device of the present invention. However, the following modifications are also possible, and the present invention is not limited to the memory access control devices described in the above embodiments.

(1) According to the structure of Embodiment 1, the system LSI chip 101 and memory chip 102 are connected with each other via the microbumps. This is because the connection via microbumps makes relatively small the parasitic capacitance, parasitic inductance and the like in the wiring path.

However, if there is little necessity for making small the parasitic capacitance, parasitic inductance and the like in the wiring path, the system LSI chip 101 and the memory chip 102 do not necessarily be connected with each other via the microbumps, but may be connected, for example, via bumps of so-called C4 (Controlled Collapse Chip Connection) or TSV. Furthermore, the system LSI chip 101 and the memory chip 102 may be both arranged on the lead frame 103 and connected with other via a bonding wire, not as independent layers. Alternatively, the system LSI chip 101 and the memory chip 102 may be mackaged into different packages and connected with other via wiring on the circuit board.

(2) According to Embodiment 1, even if it is determined that the memory data microbump group includes one or more defective-contact microbumps, when the number of the defective-contact microbumps is smaller than a predetermined number, the integrated circuit 100 is selected as a good-quality product for popular use. However, all integrated circuits 100, in which the memory data microbump group includes one or more defective-contact microbumps whose number is less than a predetermined number, do not necessarily be selected as good-quality products for popular use as far as integrated circuits 100, in which the memory data microbump group includes one or more defective-contact microbumps whose number is less than a predetermined number, are selected as good-quality products.

As one example, when the number of the defective-contact microbumps in the memory data microbump group is smaller than a first predetermined number (which is smaller than the predetermined number), the integrated circuit 100 is selected as a good-quality product for medium functionality (a product having a functionality which is lower than the good-quality product for high functionality, but is higher than the good-quality product for popular use), and is selected as a good-quality product for popular use when the number of the defective-contact microbumps in the memory data microbump group is equal to or greater than the first predetermined number and equal to or smaller than the predetermined number. This is realized by, for example, a structure where the external memory control circuit 519 includes a second repair address converting unit for performing an address conversion for good-quality product for medium functionality, as well as the regular address converting unit 601 for performing an address conversion for good-quality product for high functionality and the repair address converting unit 602 for performing an address conversion for good-quality product for popular use.

(3) According to Embodiment 1, an integrated circuit 100 is selected as a good-quality product for high functionality when the memory data microbump group therein includes no defective-contact microbump, and is selected as a good-quality product for popular use when the memory data microbump group therein includes one or more defective-contact microbumps whose number is equal to or smaller than a predetermined number.

A further modification of this structure may be a structure where, when the number of the defective-contact microbumps in the memory data microbump group is smaller than the first predetermined number, the integrated circuit 100 is selected as a good-quality product for high functionality, and is selected as a good-quality product for popular use when the number of the defective-contact microbumps in the memory data microbump group is equal to or greater than the first predetermined number and smaller than a second predetermined number which is greater than the first predetermined number. This is realized by, for example, a structure where the regular address converting unit 601 performs an address conversion in case the memory data microbump group includes one or more defective-contact microbumps whose number is smaller than the first predetermined number, and the repair address converting unit 602 performs an address conversion in case the memory data microbump group includes defective-contact microbumps whose number is equal to or greater than the first predetermined number and smaller than the second predetermined number.

(4) According to Embodiment 1, data is read from and written to the memory chip 102 in units of 512 bits, and the memory data microbump group is composed of 512 microbumps. However, data may not necessarily be read from and written to the memory chip 102 in units of 512 bits, and the memory data microbump group may not necessarily be composed of 512 microbumps as far as the masters included in the system LSI chip 101 can use the storage areas of the memory chip 102.

As one example, data may be read from and written to the memory chip 102 in units of 64 bits, and the memory data microbump group may be composed of 64 microbumps.

(5) According to Embodiment 1, the redundancy repair circuit 520 includes the eFUSE circuit 521 for storing microbump IDs identifying defective-contact microbumps. However, not limited to the structure including the eFUSE circuit 521, for example, a structure including a nonvolatile memory such as a flash memory may be adopted as far as it is possible to store microbump IDs identifying defective-contact microbumps even when the power is not supplied.

(6) According to Embodiment 1, the memory chip 102 includes four banks. However, the memory chip 102 does not necessarily include four banks as far as the masters included in the system LSI chip 101 can use the storage areas of the memory chip 102. For example, the memory chip 102 may include eight banks, or may not have the bank structure.

(7) Embodiment 7 describes a manufacturing method of two devices: a tablet terminal embedded with an integrated circuit 100 that has been selected as a good-quality product for high functionality; and a smartphone terminal embedded with an integrated circuit 100 that has been selected as a good-quality product for popular use. However, not limited to the above example, it is possible to manufacture various pairs of: a first device that is embedded with an integrated circuit 100 whose operational condition is that the system LSI chip 101 can use the memory chip 102 in a predetermined bandwidth (for example, a specific bandwidth higher than 7 GB/s and equal to or lower than 10 GB/s); and a second devide that is embedded with an integrated circuit 100 whose operational condition is not that the system LSI chip 101 can use the memory chip 102 in the predetermined bandwidth (the above specific bandwidth). As one example, the first device may be a high-functionality television that is embedded with an integrated circuit 100 selected as a good-quality product for high functionality and has a function to decode two digital TV broadcast programs at the same time, and the second device may be a popular-use television that is embedded with an integrated circuit 100 selected as a good-quality product for popular use and has a function to decode one digital TV broadcast program.

(8) According to Embodiment 1, the memory access controller 510 includes the regular address converting unit 601, repair address converting unit 602, and selector 603. However, the memory access controller 510 does not necessarily include the regular address converting unit 601, repair address converting unit 602, and selector 603 as far as a block having the same function as a block composed of the regular address converting unit 601, repair address converting unit 602, and selector 603 is provided in any portion of the signal transmission path between the masters (the first master 501 through $n^{th}$ master 503) and the memory chip 102. For example, the masters and the memory access controller 510 may be connected with each other by a bus, and the bus may include the block having the same function as the block composed of the regular address converting unit 601, repair address converting unit 602, and selector 603.

Also, according to Embodiment, the memory access controller 510 includes the R data alignment buffer 614 and W data alignment buffer 616. However, the memory access controller 510 does not necessarily include the R data alignment buffer 614 and W data alignment buffer 616 as far as a block having the same function as a block composed of the R data alignment buffer 614 and W data alignment buffer 616 is provided in any portion of the signal transmission path between the masters (the first master 501 through $n^{th}$ master 503) and the memory chip 102. For example, the masters and the memory access controller 510 may be connected with each other by a bus, and the bus may include the block having the same function as the block composed of the R data alignment buffer 614 and W data alignment buffer 616.

(9) The following describes the structure of a memory access control device according to one aspect of the present invention, its modifications and the effects.

(a) One embodiment of the present invention provides a memory access control device comprising: a logical address receiving unit configured to receive a logical address specifying a range in a storage area of an external memory; a bit position information storage unit storing bit position information indicating one or more bit positions in a bit sequence of a predetermined length; a reading unit configured to receive, by an attempt to read, a first bit sequence from the external memory in units of the predetermined length in accordance with the logical address received by the logical address receiving unit, the first bit sequence being composed of bits that are larger in number than bits stored in the range specified by the logical address; a bit sequence extracting unit configured to extract one or more bit sequences from the first bit sequence at the one or more bit positions indicated by the bit position information; and an output unit configured to generate a second bit sequence composed of bits that are equal in number to the bits stored in the range specified by the logical address, by using the one or more bit sequences extracted by the bit sequence extracting unit and output the generated second bit sequence.

With the above-described structure of the memory access control device according to one embodiment of the present invention, when the logic chip can receive only some portions of the bit sequence transmitted from the memory chip due to a defective contact or the like, the master can use the memory chip nonetheless by storing in advance the bit position information that indicates bit positions of the bits that can be received, and storing data, which is used by the master, in advance to a storage area that is not susceptible to a defective contact or the like among the whole storage area of the memory chip.

Figure 34:
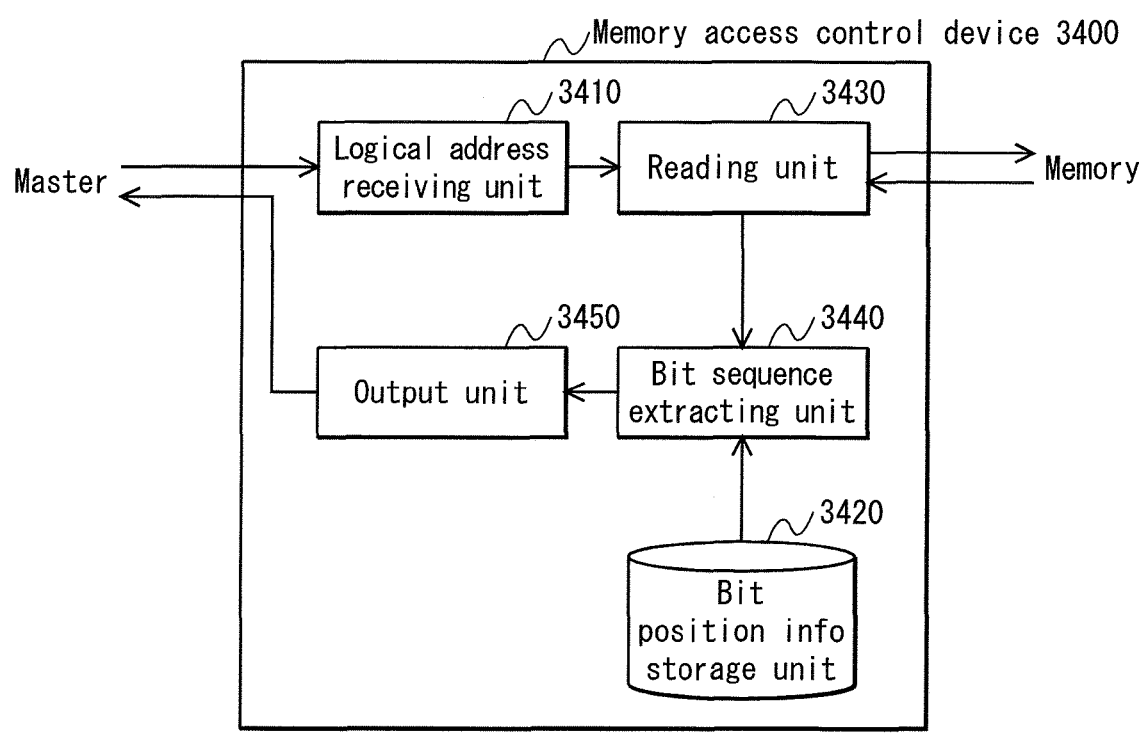
FIG. 34 is a schematic structure diagram illustrating functions of the memory access control device 3400.

FIG. 34 is a schematic structure diagram illustrating functions of a memory access control device 3400 of the above modification.

As illustrated in FIG. 34, the memory access control device 3400 includes a logical address receiving unit 3410, a bit position information storage unit 3420, a reading unit 3430, a bit sequence extracting unit 3440, and an output unit 3450.

The logical address receiving unit 3410 is connected with the reading unit 3430 and has a function to receive a logical address specifying a range in a storage area of an external memory. The logical address receiving unit 3410 is realized as, for example, a functional block in Embodiment 1 that is composed of: (1) a portion of the first master interface 511 that receives a master-issued memory command from the first master 501, temporarily stores the received command, and outputs the stored master-issued memory command to the command arbiter 516; and (2) the command arbiter 516.

The bit position information storage unit 3420 is connected with the bit sequence extracting unit 3440 and has a function to store bit position information indicating one or more bit positions in a bit sequence of a predetermined length. The bit position information storage unit 3420 is realized as, for example, the redundancy repair circuit 520.

The reading unit 3430 is connected with the logical address receiving unit 3410 and bit sequence extracting unit 3440 and has a function to receive, by an attempt to read, a first bit sequence from the external memory in units of the predetermined length in accordance with the logical address received by the logical address receiving unit 3410, the first bit sequence being composed of bits that are larger in number than bits stored in the range specified by the logical address. The reading unit 3430 is realized as, for example, a functional block in Embodiment 1 that is composed of: the repair address converting unit 602, selector 603, command queue 604, command issuance control unit 605, and timing management unit 606.

The bit sequence extracting unit 3440 is connected with the bit position information storage unit 3420, reading unit 3430, and output unit 3450 and has a function to extract one or more bit sequences from the first bit sequence, which has been received by the reading unit 3430 by the attempt to read, at the one or more bit positions indicated by the bit position information stored in the bit position information storage unit 3420. The bit sequence extracting unit 3440 is realized as, for example, the data line redundancy repair unit 611 of Embodiment 1.

The output unit 3450 is connected with the bit sequence extracting unit 3440 and has a function to generate a second bit sequence composed of bits that are equal in number to the bits stored in the range specified by the logical address received by the logical address receiving unit 3410, by using the one or more bit sequences extracted by the bit sequence extracting unit 3440 and output the generated second bit sequence. The output unit 3450 is realized as, for example, a functional block in Embodiment 1 that is composed of: (1) the data reordering unit 612, (2) the attribute assigning unit 613, (3) the R data alignment buffer 614, (4) the data buffer 517, and (5) a portion of the first master interface 511 that receives data, from the data buffer 517, data having been read from a storage area of the memory chip 102 and output the data to the first master 501.

(b) The above-described memory access control device may further comprise: a bit sequence receiving unit configured to receive a bit sequence that is to be written to the external memory; a generating unit configured to generate one or more correction bit sequences from the received bit sequence, each of the one or more correction bit sequences being shorter than the predetermined length; a bit sequence expanding unit configured to generate an expanded bit sequence of the predetermined length by expanding the bit sequence received by the bit sequence receiving unit by inserting one or more dummy bits into the one or more bit positions indicated by the bit position information stored in the bit position information storage unit, and using the one or more correction bit sequences; and a writing unit configured to transmit, by an attempt to write, the expanded bit sequence to the external memory in units of the predetermined length, in accordance with the logical address received by the logical address receiving unit.

With the above-described structure, when the memory chip can store only some portions of the bit sequence transmitted from the logic chip due to a defective contact or the like, the master can store data in a storage area of the memory chip.

(c) The above-described memory access control device may further comprise: an address converting unit configured to convert the logical address to a physical address specifying a range in the storage area of the external memory, wherein the range specified by the physical address stores bits larger in number than the range specified by the logical address, wherein the reading unit receives, by an attempt to read, data from the range specified by the physical address, and the writing unit transmits, by an attempt to write, data to the range specified by the physical address.

With the above-described structure, the memory access control device can access the range in the storage area specified by the physical address converted by the address converting unit.

(d) In the above-described memory access control device, the bit position information stored in the bit position information storage unit may be information relating to a failure that occurs in a communication between the memory access control device and the external memory, the memory access control device further comprising: a failure detecting unit configured to detect a failure that occurs in a communication between the memory access control device and the external memory, by performing a process concerning the communication between the memory access control device and the external memory; and a bit position information updating unit configured to update the bit position information stored in the bit position information storage unit in accordance with the failure detected by the failure detecting unit.

With the above-described structure, the memory access control device can update the bit position information stored in the bit position information storage unit in accordance with the failure that occurs in a communication with the external memory and is detected by the failure detecting unit.

(e) In the above-described memory access control device, the external memory may include a plurality of storage banks, and the address converting unit may perform the conversion such that the range specified by the physical address includes at least part of each of two storage banks among the plurality of storage banks.

With the above-described structure, the master can use a range in the storage area that includes at least part of each of two storage banks.

(f) In the above-described memory access control device, the address converting unit may be a repair address converting unit, the memory access control device may further comprise: a regular address converting unit configured to convert the logical address to a regular physical address specifying a range in the storage area of the external memory, wherein the range specified by the regular physical address includes a same number of bits as the range specified by the logical address; and a selector configured to select either the physical address converted by the repair address converting unit or the regular physical address converted by the regular address converting unit, wherein the reading unit receives, by the attempt to read, the first bit sequence only when the selector selects the physical address converted by the repair address converting unit, and when the selector selects the regular physical address converted by the regular address converting unit, receives, by the attempt to read, a bit sequence from the range specified by the regular physical address in units of the predetermined length, the output unit outputs the generated second bit sequence only when the selector selects the physical address converted by the repair address converting unit, and when the selector selects the regular physical address converted by the regular address converting unit, outputs the bit sequence read by the reading unit, and the writing unit transmits, by the attempt to write, the expanded bit sequence only when the selector selects the physical address converted by the repair address converting unit, and when the selector selects the regular physical address converted by the regular address converting unit, transmits, by an attempt to write, a bit sequence to be written to the external memory to the range specified by the regular physical address in units of the predetermined length.

With the above-described structure, the memory access control device can access a range in the storage area specified by the converted physical address, by using either the physical address converted by the repair address converting unit or the regular physical address converted by the regular address converting unit in accordance with the selection state of the selecting unit.

(g) In the above-described memory access control device, the number of accesses of the reading unit to the external memory by the attempt to read the first bit sequence may be larger than the number of accesses of the reading unit to the external memory by the attempt to read the data from the range in the storage area of the external memory specified by the logical address received by the logical address receiving unit, in units of the predetermined length.

With the above-described structure, the memory access control device can increase the number of bits of the bit sequence that is the target of the attempt to read, by increasing the number of accesses of the reading unit to the external memory by the attempt to read the first bit sequence.

(h) One embodiment of the present invention provides a manufacturing method of a first device or a second device, each of the first device and the second device including a first chip and a second chip, the first chip including a memory, the second chip including a master accessing the memory, the first chip and the second chip being sealed in one package, the first device being a device whose operation condition is that a bit rate equal to or higher than a predetermined bit rate is secured for the access to the memory by the master, the second device being a device whose operation condition is not that a bit rate equal to or higher than a predetermined bit rate is secured for the access to the memory by the master, the manufacturing method comprising: an evaluation step of evaluating whether or not it is possible to secure a bit rate equal to or higher than a predetermined bit rate, by performing a check on the integrated circuit with regard to the access to the memory by the master; a first manufacturing step of manufacturing the first device by embedding the integrated circuit therein when a result of evaluation on the integrated circuit by the evaluation step is positive, and a second manufacturing step of manufacturing the second device by embedding the integrated circuit therein when a result of evaluation on the integrated circuit by the evaluation step is negative.

With the above-described structure of the manufacturing method according to one embodiment of the present invention, an integrated circuit, which cannot be used embedded in the first device because a bit rate equal to or higher than a predetermined bit rate is not secured for the master to access the memory, can be used embedded in the second device.

(i) In the above-described manufacturing method, the integrated circuit may be structured such that the first chip and the second chip are electrically connected with each other via a plurality of bumps, the master may perform a data communication for the access to the memory via at least one of the plurality of bumps, and the check may include a check with regard to an electrical connection failure in the plurality of bumps.

With the above-described structure, an integrated circuit, in which a bit rate equal to or higher than a predetermined bit rate is not secured for the master to access the memory due to defective-contact microbumps, can be used embedded in the second device.

INDUSTRIAL APPLICABILITY

The present invention can be used broadly in devices which use a memory.

REFERENCE SIGNS LIST

100 integrated circuit
101 system LSI chip
102 memory chip
510 memory access controller
511 first master interface
512 second master interface
513 $n^{th}$ master interface 513
516 command arbiter
517 data buffer
519 external memory control circuit
520 redundancy repair circuit
521 eFUSE circuit
601 regular address converting unit
602 repair address converting unit
603 selector
604 command queue
605 command issuance control unit
606 timing management unit
611 data line redundancy repair unit
612 data reordering unit
613 attribute assigning unit
614 R data alignment buffer
615 data reordering unit
616 W data alignment buffer

The invention claimed is:

1. A memory access control device comprising:
a logical address receiving unit configured to receive a logical address specifying a range in a storage area of an external memory;
a bit position information storage unit storing bit position information indicating one or more bit positions in a bit sequence of a predetermined length;
a reading unit configured to attempt to read a bit sequence from the range specified by the logical address received by the logical address receiving unit, thereby receiving a first bit sequence from the external memory in units of the predetermined length, the first bit sequence being composed of bits that are larger in number than bits stored in the range specified by the logical address;
a bit sequence extracting unit configured to extract one or more bit sequences from the first bit sequence at the one or more bit positions indicated by the bit position information in units of the predetermined length; and
an output unit configured to generate a second bit sequence composed of bits that are equal in number to the bits stored in the range specified by the logical address, by using the one or more bit sequences extracted by the bit sequence extracting unit and output the generated second bit sequence.

2. The memory access control device of claim 1 further comprising:
a bit sequence receiving unit configured to receive a bit sequence that is to be written to the external memory;
a generating unit configured to generate one or more correction bit sequences from the received bit sequence, each of the one or more correction bit sequences being shorter than the predetermined length;
a bit sequence expanding unit configured to generate an expanded bit sequence of the predetermined length by expanding the bit sequence received by the bit sequence receiving unit by inserting one or more dummy bits into the one or more bit positions indicated by the bit position information stored in the bit position information storage unit, and using the one or more correction bit sequences; and
a writing unit configured to transmit, by an attempt to write, the expanded bit sequence to the external memory in units of the predetermined length, in accordance with the logical address received by the logical address receiving unit.

3. The memory access control device of claim 2 further comprising:
an address converting unit configured to convert the logical address to a physical address specifying a range in the storage area of the external memory, wherein the range specified by the physical address stores bits larger in number than the range specified by the logical address, wherein
the reading unit receives, by an attempt to read, data from the range specified by the physical address, and
the writing unit transmits, by an attempt to write, data to the range specified by the physical address.

4. The memory access control device of claim 3, wherein
the bit position information stored in the bit position information storage unit is information relating to a failure that occurs in a communication between the memory access control device and the external memory,
the memory access control device further comprising:
a failure detecting unit configured to detect a failure that occurs in a communication between the memory access control device and the external memory, by performing a process concerning the communication between the memory access control device and the external memory; and
a bit position information updating unit configured to update the bit position information stored in the bit position information storage unit in accordance with the failure detected by the failure detecting unit.

5. The memory access control device of claim 3, wherein
the external memory includes a plurality of storage banks, and
the address converting unit performs the conversion such that the range specified by the physical address includes at least part of each of two storage banks among the plurality of storage banks.

6. The memory access control device of claim 3, wherein
the address converting unit is a repair address converting unit,
the memory access control device further comprises:
a regular address converting unit configured to convert the logical address to a regular physical address specifying a range in the storage area of the external memory, wherein the range specified by the regular physical address includes a same number of bits as the range specified by the logical address; and
a selector configured to select either the physical address converted by the repair address converting unit or the regular physical address converted by the regular address converting unit, wherein
the reading unit receives, by the attempt to read, the first bit sequence only when the selector selects the physical address converted by the repair address converting unit, and when the selector selects the regular physical address converted by the regular address converting unit, receives, by the attempt to read, a bit sequence from the range specified by the regular physical address in units of the predetermined length,
the output unit outputs the generated second bit sequence only when the selector selects the physical address converted by the repair address converting unit, and when the selector selects the regular physical address converted by the regular address converting unit, outputs the bit sequence read by the reading unit, and
the writing unit transmits, by the attempt to write, the expanded bit sequence only when the selector selects the physical address converted by the repair address converting unit, and when the selector selects the regular physical address converted by the regular address converting unit, transmits, by an attempt to write, a bit sequence to be written to the external memory in the range specified by the regular physical address in units of the predetermined length.

7. The memory access control device of claim 1, wherein
the number of accesses of the reading unit to the external memory by the attempt to read the first bit sequence is larger than the number of accesses of the reading unit to the external memory by the attempt to read the data from the range in the storage area of the external memory specified by the logical address received by the logical address receiving unit, in units of the predetermined length.

* * * * *